(12) United States Patent
Lilak et al.

(10) Patent No.: US 11,424,160 B2
(45) Date of Patent: Aug. 23, 2022

(54) SELF-ALIGNED LOCAL INTERCONNECTS

(71) Applicant: INTEL CORPORATION, Santa Clara, CA (US)

(72) Inventors: Aaron D. Lilak, Beaverton, OR (US); Ehren Mannebach, Beaverton, OR (US); Anh Phan, Beaverton, OR (US); Richard Schenker, Portland, OR (US); Stephanie A. Bojarski, Beaverton, OR (US); Willy Rachmady, Beaverton, OR (US); Patrick Morrow, Portland, OR (US); Jeffery Bielefeld, Forest Grove, OR (US); Gilbert Dewey, Beaverton, OR (US); Hui Jae Yoo, Hillsboro, OR (US); Nafees Kabir, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 679 days.

(21) Appl. No.: 16/274,758

(22) Filed: Feb. 13, 2019

(65) Prior Publication Data
US 2020/0258778 A1    Aug. 13, 2020

(51) Int. Cl.
*H01L 21/768* (2006.01)
*H01L 29/78* (2006.01)
(Continued)

(52) U.S. Cl.
CPC .. *H01L 21/76897* (2013.01); *H01L 21/02603* (2013.01); *H01L 21/823814* (2013.01); *H01L 21/823821* (2013.01); *H01L 21/823871* (2013.01); *H01L 21/823878* (2013.01); *H01L 23/5226* (2013.01); *H01L 27/0924* (2013.01); *H01L 29/66795* (2013.01); *H01L 29/785* (2013.01); *H01L 2029/7858* (2013.01)

(58) Field of Classification Search
CPC ....... H01L 21/76895; H01L 21/823871; H01L 21/823814; H01L 29/0653; H01L 29/41791
See application file for complete search history.

(56) References Cited

U.S. PATENT DOCUMENTS 10,510,600 B1 * 12/2019 Hsu .................. H01L 21/76897
10,755,978 B2 * 8/2020 Hsu .................. H01L 29/66795
(Continued)

*Primary Examiner* — Changhyun Yi
(74) *Attorney, Agent, or Firm* — Schwabe, Williamson & Wyatt, P.C.

(57) ABSTRACT

In some embodiments, a semiconductor device structure is formed by using an angled etch to remove material so as to expose a portion of an adjacent conductor. The space formed upon removing the material can then be filled with a conductive material during formation of a contact or other conductive structure (e.g., and interconnection). In this way, the contact formation also fills the space to form an angled local interconnect portion that connects adjacent structures (e.g., a source/drain contact to an adjacent source/drain contact, a source/drain contact to an adjacent gate contact, a source/drain contact to an adjacent device level conductor also connected to a gate/source/drain contact). In other embodiments, an interconnection structure herein termed a "jogged via" establishes and electrical connection from laterally adjacent peripheral surfaces of conductive structures that are not coaxially or concentrically aligned with one another.

25 Claims, 19 Drawing Sheets

(51) Int. Cl.
  *H01L 29/66*    (2006.01)
  *H01L 27/092*   (2006.01)
  *H01L 23/522*   (2006.01)
  *H01L 21/8238*  (2006.01)
  *H01L 21/02*    (2006.01)

(56) References Cited

U.S. PATENT DOCUMENTS

2016/0020138 A1   1/2016  Chang et al.
2018/0286957 A1*  10/2018 Bae .................... H01L 27/1104

* cited by examiner

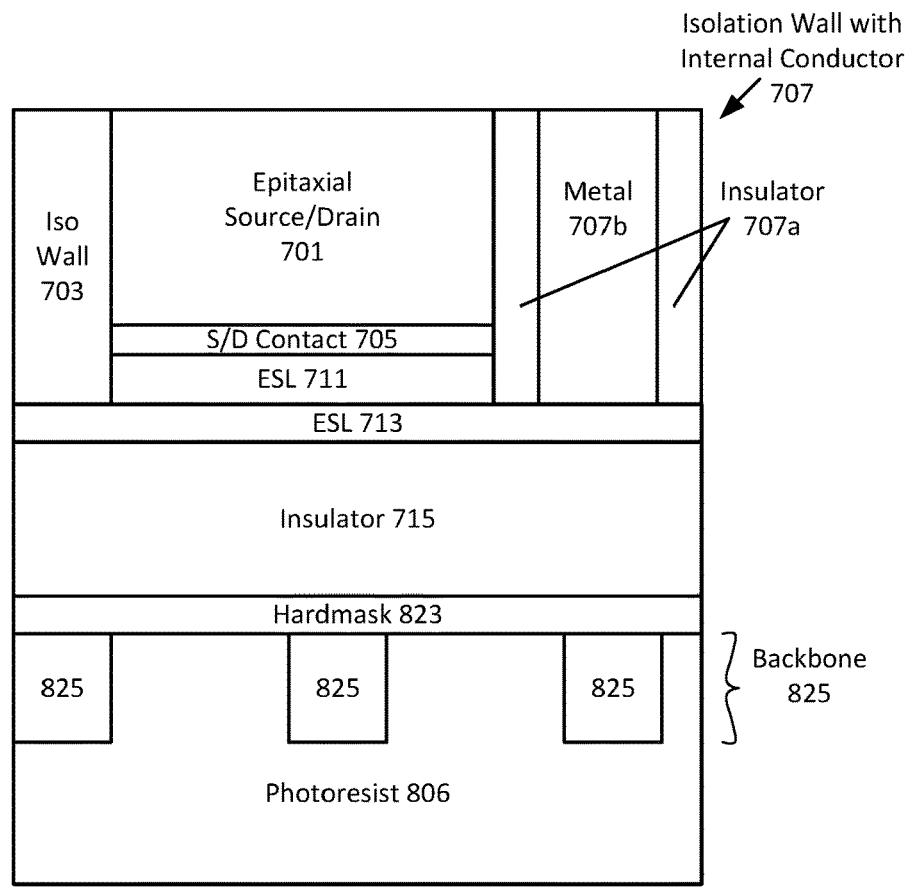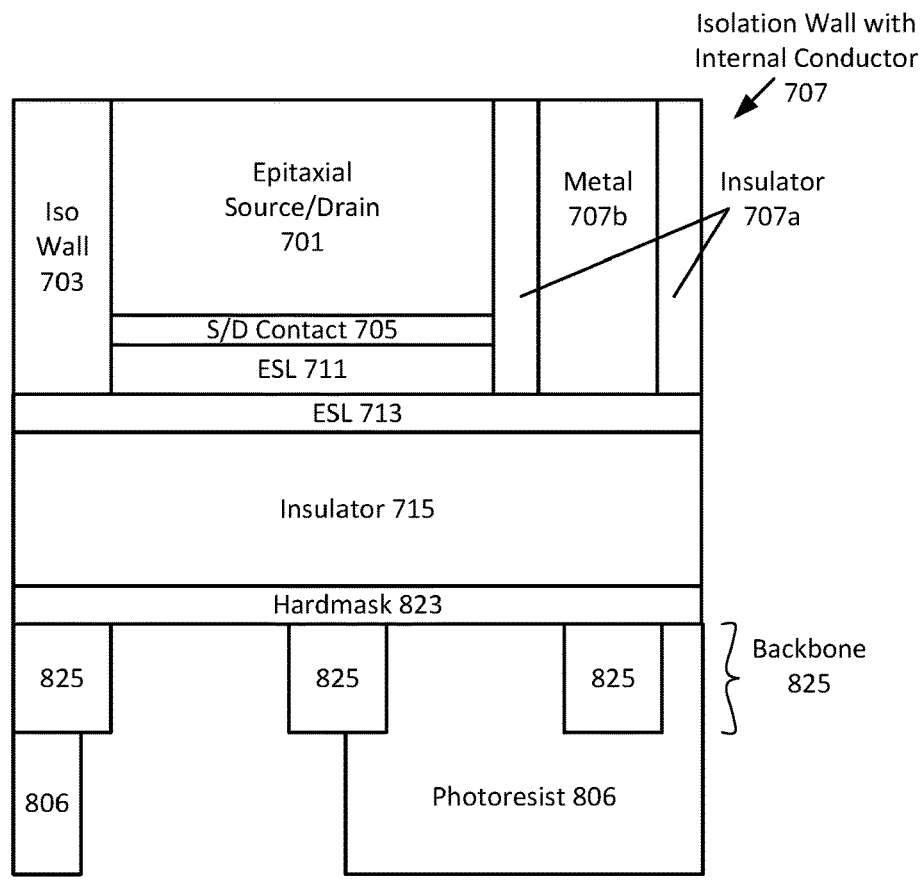

SELF-ALIGNED LOCAL INTERCONNECTS

BACKGROUND

Integrated circuits generally include transistors electrically connected or arranged to form functional circuits. Although there are effectively an infinite number of circuit configurations, in some cases a given transistor circuit may include, for instance, a transistor that has one or both of its source and drain contacts connected to the gate contact of that same transistor. Likewise, a transistor may have one of its source, drain, and/or gate contacts connected to a source, drain, and/or gate contact of an adjacent transistor. Such connections typically involve the use of interconnections (e.g., vias and metal lines). In particular, a via can extend upward from a first semiconductor structure (e.g., a source contact, a drain contact, a gate contact) within the device layer into one or more interconnect layers above the device layer and connect to a metal line. The metal line can in turn connect to another via that extends downward to a second semiconductor structure (e.g., an adjacent source contact or drain contact of an adjacent semiconductor device, a gate region of a same semiconductor device) in the device layer. Depending on the configuration of the vias and metal lines, these types of connections can be described as "up-and-over" or "wrap-around" interconnections, and generally include a lateral metal run in a different layer from the features being connected.

BRIEF DESCRIPTION OF THE DRAWINGS

FIG. 8a-8k illustrate an example process of forming a jogged-via structure for connecting a source/drain contact structure to an adjacent metal conductor, in accordance with an embodiment of the present disclosure.

Figure 1A:
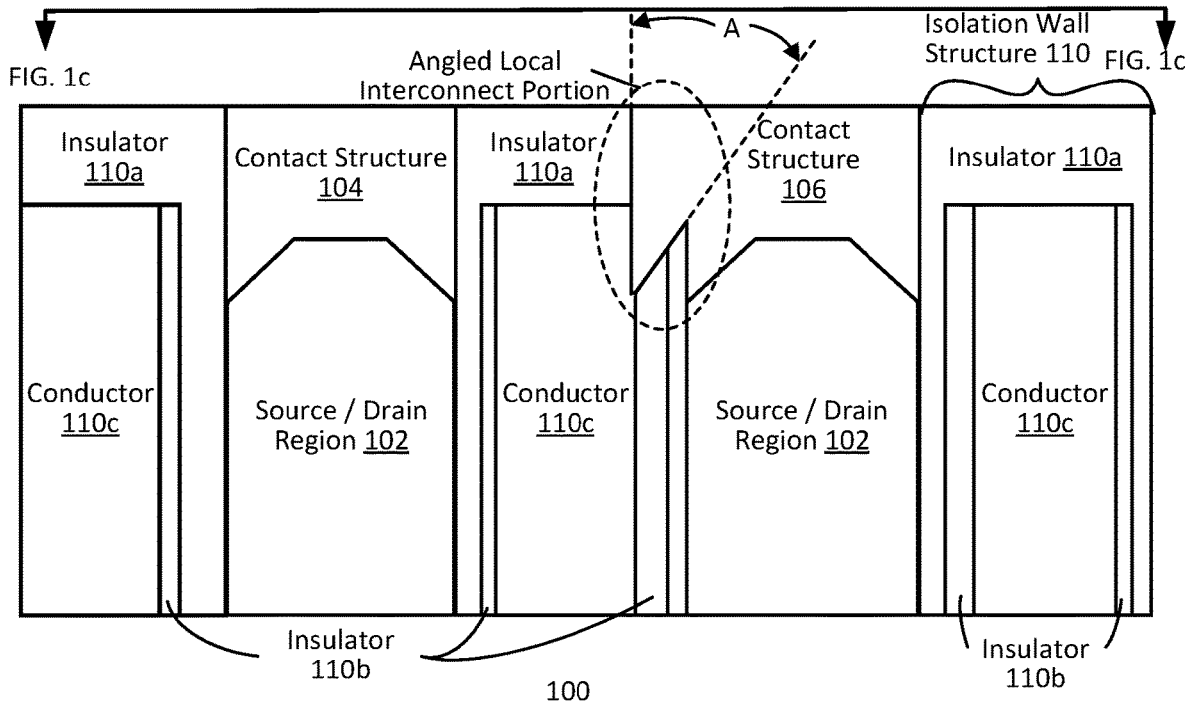
FIG. 1a illustrates a cross-section view, taken through the source/drain regions and parallel to a gate structure, of an integrated circuit structure that includes an angled local interconnect that extends laterally from a source or drain contact structure to a conductor in an isolation wall structure, in accordance with an embodiment of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Semiconductor devices and corresponding fabrication methods are disclosed. In some embodiments, a semiconductor device structure is formed by using an angled etch to remove material so as to expose a portion of an adjacent conductor. The space formed upon removing the material can then be filled with one or more conductive materials during formation of a contact or other conductive structure (e.g., and interconnection). In this way, the contact formation also fills the space to form an angled local interconnect portion that connects adjacent structures (e.g., a source/drain contact to an adjacent source/drain contact, or a source/drain contact to an adjacent gate contact, or a source/drain contact to an adjacent device level conductor). These device level connections can be made with greater convenience and reliability than up-and-over or wrap-around interconnections that extend from the device level to an interconnect level above the device level. Many variations for lateral local interconnects having an angled portion will be appreciated. Still other embodiments described herein include an interconnection structure termed herein a "jogged via." Jogged vias establish an electrical connection from laterally adjacent peripheral surfaces of conductive structures that are not coaxially, colinearly, or concentrically aligned with one another. This can improve the reliability and manufacturing convenience of establishing interconnections, particularly for closely spaced structures that optionally may also be difficult to align because of their dimensions. Selective etch schemes allow the jogged vias to be formed in a self-aligned manner. Many variations will be appreciated.

General Overview

A number of non-trivial issues are associated with the interconnection of adjacent semiconductor structures of a given a device layer using vias and metal lines that extend from the device layer, into one or more interconnection layers (e.g., layers above or below the device layer that are associated with vias and metal lines, e.g., "V0, V1, M0, M1") and back down (or up, as the case may be) to the device layer. This type of interconnection is commonly referred to as an "up-and-over" interconnection. Similarly configured "wrap-around" interconnections also utilize additional layers to make the connection between adjacent devices. These solutions are susceptible to lithographic constraints and placement and patterning errors, and are not well-suited to forming connections at tight pitch/scaled dimension.

Thus, techniques are disclosed for forming device level or local conductive interconnect structures. The techniques are particularly well-suited form interconnecting source, drain, and/or gate contact structures of a given device layer, whether to each other or a laterally adjacent conductor. In one embodiment, the interconnect structure includes an angled local interconnection portion that extends laterally between features being connected. In some embodiments, these techniques can be used to form local interconnects within a device layer itself. In some such embodiments, an angled local interconnect portion associated with device level conductive structures can connect, for example, gate, source, and/or drain regions of a given semiconductor device, or can connect neighboring devices either directly or indirectly by way of a conductor m embedded within an isolation wall (that in turn is connected to, for example, a source/drain/gate electrode, or other contact structure, or a signal source, or a power source). In some embodiments, the angled local interconnect portion is formed using a directional etch provided at an incident angle greater than 0° and less than 90° to expose a portion of a laterally adjacent device level conductive structure. The trench laterally adjacent to the exposed portion can then be filled during formation of a contact structure on or over an element of a semiconductor device, thus forming a local interconnect portion between the gate, source, and/or drain region and an adjacent structure. Due to the selective nature of the forming process, the sidewall of the angled portion is self-aligned to the sidewall of the laterally adjacent feature to which it contacts.

In still other embodiments, a type of interconnection herein termed a "jogged via" is described. This type of interconnect establishes an electrical connection between conductive structures that are laterally adjacent one another but not coaxially, colinearly, or concentrically aligned with one another. Again, due to the selective nature of the forming process, the sidewall of the jogged via is self-aligned to the sidewall of the laterally adjacent feature to which it contacts. This can be more convenient than attempting to align parallel, terminal faces of coaxial, concentric vias and/or metal lines. This type of arrangement can improve the quality, reliability, and manufacturing convenience of establishing interconnections at nanometer scale pitches and feature sizes. It will be appreciated that various devices can include both local angled interconnect portions and jogged vias. embodiments.

Various advantages of the techniques provided herein will be appreciated, particularly with respect to improved transistor density, performance, and reliability. Furthermore, techniques used to fabricate some embodiments described herein can produce local interconnects that require fewer processing steps and lower production costs than wrap around or up and over interconnections, among other benefits. For instance, avoiding or otherwise reducing the occurrence of up-and-over or wrap-around connections may reduce the number of interconnect structures above the device level, and/or may reduce the likelihood of producing defective ICs. Some of the embodiments herein that include angled local interconnect portions may allow for shorter, more direct (lateral connection rather than up-and-over connection), local interconnects that can reduce Z-dimensional thickness, areal footprint, capacitance, and/or resistance of the routing. It will be further appreciated that some of the embodiments that include angled local interconnect portions and/or jogged vias improve the convenience and accuracy of IC formation because these structures have a "self-aligning" aspect that reduces the need for precise lithographic processing often relied on in wrap-around and/or up-and-over interconnections from the device level. Furthermore, using angled local interconnections and jogged vias may in some cases reduce the amount of metal in an interconnection relative to up-and-over and wrap-around techniques. This, in turn can reduce capacitance of an IC. As will be further appreciated, a structure configured in accordance with some embodiments can reduce the complexity and density of interconnections relative to other designs, thus reducing the need for complex and error prone patterning techniques.

Numerous configurations and permutations will be apparent in light of this disclosure.

Architectures

FIG. 1a illustrates a cross-sectional view of an integrated circuit (IC) structure 100 taken through the source/drain regions and parallel to a gate structure. As shown, the IC structure 100 includes source/drain regions 102, a first contact structure 104, and a second contact structure 106 that further includes an angled local interconnect portion. The IC structure 100 also includes an isolation wall structure 110 that, in this embodiment, further includes a first insulator 110a, a second insulator 110b, and a conductor 110c.

A multitude of different transistor devices can benefit from the techniques described herein, which includes, but is not limited to, various field-effect transistors (FETs), such as metal-oxide-semiconductor FETs (MOSFETs), tunnel FETs (TFETs), and Fermi filter FETs (FFFETs) (also known as tunnel source MOSFETs), to name a few examples. For example, the techniques may be used to benefit an n-channel MOSFET (NMOS) device, which may include a source-channel-drain scheme of n-p-n or n-i-n, where 'n' indicates n-type doped semiconductor material, 'p' indicates p-type doped semiconductor material, and 'i' indicates intrinsic/undoped semiconductor material (which may also include nominally undoped semiconductor material, including dopant concentrations of less than 1E16 atoms per cubic centimeter (cm), for example), in accordance with some embodiments. In another example, the techniques may be used to benefit a p-channel MOSFET (PMOS) device, which may include a source-channel-drain scheme of p-n-p or p-i-p, in accordance with some embodiments. In yet another example, the techniques may be used to benefit a TFET device, which may include a source-channel-drain scheme of p-i-n or n-i-p, in accordance with some embodiments. In still another example, the techniques may be used to benefit a FFFET device, which may include a source-channel-drain scheme of np-i-p (or np-n-p) or pn-i-n (or pn-p-n), in accordance with some embodiments.

In addition, in some embodiments, the techniques may be used to benefit transistors including a multitude of configurations, such as planar and/or non-planar configurations, where the non-planar configurations may include finned or FinFET configurations (e.g., dual-gate or tri-gate), gate-all-around (GAA) configurations (e.g., nanowire or nanoribbon), or some combination thereof (e.g., a beaded-fin configurations), to provide a few examples. Many of the examples described herein show FinFETS, which were selected for convenience of depiction.

Further, the techniques may be used to benefit complementary transistor circuits, such as complementary MOS (CMOS) circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

While not shown, it will be appreciated that the IC structure 100 (and other example embodiment structures described throughout the present disclosure) can be fabricated on a semiconductor substrate. A semiconductor substrate, in some embodiments may include a bulk Si substrate (e.g., a bulk Si wafer), a Si on insulator (SOI) structure where an insulator/dielectric material (e.g., an oxide material, such as silicon dioxide) is sandwiched between two Si layers (e.g., in a buried oxide (BOX) structure), or any other suitable starting substrate where the top layer includes Si. In some embodiments, the substrate may be doped with any suitable n-type and/or p-type dopant at a dopant concentration in the range of 1E16 to 1E22 atoms per cubic cm, for example. For instance, the Si of the substrate may be p-type doped using a suitable acceptor (e.g., boron) or n-type doped using a suitable donor (e.g., phosphorous, arsenic) with a doping concentration of at least 1E16 atoms per cubic cm. However, in some embodiments, the substrate may be undoped/intrinsic or relatively minimally doped (such as including a dopant concentration of less than 1E16 atoms per cubic cm), for example. In general, although the substrate is referred to herein as a Si substrate, in some embodiments, it may essentially consist of Si, while in other embodiments, the substrate may primarily include Si but may also include other material (e.g., dopant at a given concentration). Also note that the substrate may include relatively high quality or device quality monocrystalline Si that provides a suitable template/seeding surface from which other monocrystalline semiconductor material features and layers can be formed. Therefore, unless otherwise explicitly stated, a Si substrate as described herein is not intended to be limited to a substrate that only includes Si.

In some embodiments, the substrate may include a surface crystalline orientation described by a Miller index of (100), (110), or (111), or its equivalents, as will be apparent in light of this disclosure. Although substrate 200, in this example embodiment, is shown as having a thickness (dimension in the Y-axis direction) similar to other layers in the figures for ease of illustration, in some instances, the substrate may be relatively much thicker than the other layers, such as having a thickness in the range of 1 to 950 microns (or in the sub-range of 20 to 800 microns), for example, or any other suitable thickness value or range as will be apparent in light of this disclosure. In some embodiments, the substrate may include a multilayer structure including two or more distinct layers (that may or may not be compositionally different). In some embodiments, the substrate may include grading (e.g., increasing and/or decreasing) of one or more material concentrations throughout at least a portion of the substrate. In some embodiments, the substrate may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

The source/drain regions 102 can, in some embodiments, may be formed using any suitable techniques, such as masking regions outside of the S/D regions to be processed, etching at least a portion of fins formed from the substrate (i.e., removing the "native fins"), and forming/depositing/growing epitaxial S/D regions (e.g., using any suitable techniques, such as CVD, PVD, ALD, VPE, MBE, LPE), for example. In some cases, these are known as "replacement fins." In some embodiments, native fins formed from the material of the substrate need not be completely removed, but may remain (at least in part) in the final S/D regions and be doped, implanted, and/or clad with final S/D material and/or have any other suitable processing performed to convert them into suitable final S/D regions, for example. In some embodiments, one or more of the S/D regions may have a multilayer structure including two or more distinct layers, for example. For instance, in FFFET configurations, the source region has a bi-layer structure that includes two oppositely doped layers (e.g., one is n-type doped and the other is p-type doped), for example. In some embodiments, one or more of the S/D regions may include grading (e.g., increasing and/or decreasing) the content/concentration of one or more materials in some or all of the region(s). For instance, in some embodiments, it may be desired to increase the grading as a given S/D region is formed, to have a relatively lower doping concentration near the channel region and a relatively higher doping concentration near the corresponding S/D contact.

In some embodiments, the S/D regions may be formed one polarity at a time, such as performing processing for one of n-type and p-type S/D regions, and then performing processing for the other of the n-type and p-type S/D regions. In some embodiments, the S/D regions may m include any suitable material, such as monocrystalline group IV and/or group III-V semiconductor material and/or any other suitable semiconductor material, as will be apparent in light of this disclosure. In some embodiments, the S/D regions corresponding to a given channel region may include the same group of semiconductor material as what is included in the given channel region, such that if the given channel region includes group IV semiconductor material, the corresponding S/D regions may also include group IV semiconductor material (whether the same IV material or different); however, the present disclosure is not intended to be so limited. In some embodiments, the S/D regions may include any suitable doping scheme, such as including suitable n-type and/or p-type dopant (e.g., in a concentration in the range of 1E16 to 1E22 atoms per cubic cm). However, in some embodiments, at least one S/D region may be undoped/intrinsic or relatively minimally doped, such as including a dopant concentration of less than 1E16 atoms per cubic cm, for example.

To provide some example configurations, in embodiments where corresponding S/D regions on either side of a given channel region are to be used for a MOSFET device, the S/D regions may include the same type of dopants (e.g., where both are p-type doped or both are n-type doped). Specifically, for an n-MOS device, the included S/D regions include semiconductor material that is n-type doped, and for a p-MOS device, the included S/D regions include semiconductor material that is p-type doped, in some embodiments. Whereas for a TFET device, the S/D regions for a given channel region may be oppositely doped, such that one is p-type doped and the other is n-type doped, in some embodiments.

A gate structure is not shown in FIG. 1a for convenience of depiction. However, gate structures appear in other embodiments described below and it will be appreciated that in this embodiment, and some others described herein, a gate structure is present and can be fabricated using "a gate last" or a "gate first" technique. Regardless of the technique used to form it, an example gate structure can include a gate dielectric layer (e.g., including one or more oxide material layers) and a gate electrode (e.g., including a poly-silicon material or other conductive material).

In some embodiments, side-wall spacers, referred to generally as gate spacers (or simply, spacers), may be present on either side of the gate structure. These spacers can help determine the channel length and/or help with replacement gate ("gate last") processing, for example. Spacers may include any suitable material, such as any suitable electrical insulator, dielectric, oxide (e.g., silicon oxide), carbon-doped oxide, and/or nitride (e.g., silicon nitride) material, as will be apparent in light of this disclosure. Note that in some embodiments, a hardmask (not shown) may be formed over the dummy gate stack (which may or may not be also be formed over spacers) to protect the dummy gate stack during subsequent processing, for example.

In some embodiments, a gate structure may include a gate dielectric layer and/or a gate electrode layer, each of which may include a multilayer structure of two or more material layers, for example. For instance, in some embodiments, a multilayer gate dielectric may be employed to provide a more gradual electric transition from the channel region to the gate electrode, for example. In some embodiments, gate dielectric and/or gate electrode may include grading (e.g., increasing and/or decreasing) the content/concentration of one or more materials in at least a portion of the feature(s). The gate dielectric may be, for example, any suitable gate dielectric material(s) such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used. Further, the gate electrodes may comprise a wide range of suitable metals or metal alloys, such as aluminum, tungsten, titanium, tantalum, copper, titanium nitride, or tantalum nitride, for example, or other suitable materials in light of the present disclosure. One or more additional layers may also be present in the final gate stack, in some embodiments, such as one or more relatively high or low work function layers and/or other suitable layers, for example. The gate structure (including the gate dielectric layer(s) and gate electrode layer(s) can be formed via any suitable process, including but not limited to sputtering, physical vapor deposition (PVD), plasma assisted chemical vapor deposition, chemical vapor deposition (CVD), atomic layer deposition (ALD), MOCVD, MBE, among others. Note that although a gate dielectric is only shown below gate electrode, in other embodiments, a gate dielectric may also be present on one or both sides of gate electrode, such that the gate dielectric is between gate electrode and one or both spacers, for example. Numerous different gate stack configurations will be apparent in light of this disclosure.

The insulation layers described herein can be formed from materials also used for interlayer dielectric and/or shallow trench isolation layers. Example insulator materials that can be used for the various insulator layers here (e.g., insulator 110a, insulator 110b, insulator 124, and those appearing in subsequent examples, such as elements of isolation wall structure 310, insulators 410a, 410b, insulator 524, insulator 607, among others) and include, for instance, nitrides (e.g., $Si_3N_4$), oxides (e.g. $SiO_2$, $Al_2O_3$), oxynitrides (e.g., $SiO_xN_y$), carbides (e.g., SiC), oxycarbides, polymers, silanes, siloxanes, or other suitable insulator materials. In some embodiments, the insulator layers in this example and the subsequently described examples can be implemented with ultra-low-k insulator materials, low-k dielectric materials, or high-k dielectric materials depending on the application. Example low-k and ultra-low-k dielectric materials include porous silicon dioxide, carbon doped oxide (CDO), organic polymers such as perfluorocyclobutane or polytetrafluoroethylene, fluorosilicate glass (FSG), and organosilicates such as silsesquioxane, siloxane, or organosilicate glass. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Techniques for forming these various insulator layers can be any of a wide range of suitable deposition techniques, including but not necessarily limited to: physical vapor deposition (PVD); chemical vapor deposition (CVD); spin coating/spin-on deposition (SOD); atomic layer deposition (ALD); and/or a combination of any of the aforementioned. Other suitable configurations, materials, deposition techniques, and/or thicknesses for these layers will be apparent in light of this disclosure.

Returning to FIG. 1a, the first contact structure 104 and the second contact structure 106 establish electrical contact between the source/drain regions 102 and other interconnect structures above the device level, such as vias or metal lines. The first contact structure 104 and the second contact structure 106 can include a silicide, a germanide, a III-V compound, any of which are formed from the partial conversion of underlying source/drain region 102. In some embodiments, first contact structure 104 and the second contact structure 106 may include aluminum or tungsten, although any suitable conductive metal or alloy can be used, such as silver, nickel-platinum, or nickel-aluminum, for example. In some embodiments, first contact structure 104 and the second contact structure 106 may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the first contact structure 104 and the second contact structure 106, such as adhesion layers (e.g., titanium nitride) and/or liner or barrier layers (e.g., tantalum nitride), if so desired. In some embodiments, a contact resistance reducing layer may be present between a given S/D region 102 and its corresponding one of a first contact structure 104 or a second contact structure 106, m such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding S/D region 102, for example. The components of the contact structures (as well as other metal layers used for establishing electrical contact) can be formed using any of sputtering, physical vapor deposition (PVD), plasma assisted chemical vapor deposition, chemical vapor deposition (CVD), atomic layer deposition (ALD), MOCVD, MBE, among others.

In some embodiments, as shown in FIG. 1a, the source/drain regions 102 are separated by isolation wall structures 110. As indicated above, the isolation wall structures 110 can further include the first insulator 110a, the second insulator 110b, and the conductor 110c. In some example embodiments, materials used to form the first insulator 110a and the second insulator 110b of the isolation wall structures 110 can include an oxynitride or carbon-doped oxynitride, silicon oxide, or other suitable material. In some examples, the materials used to form the first insulator 110a and the second insulator 110b of the isolation wall structures 110, can include any materials used to form interlayer dielectric layers (not shown) or shallow trench isolation layers (not shown). It will be appreciated that insolation wall structures 110 can be present in different configurations on a single die, where some isolation wall structures 110 include a conductor 110c as described above, while other isolation wall structures include an insulator instead of a conductor.

In some examples, the first insulator 110a and second insulator 110b may be a single structure that is compositionally uniform, and that conformally coats the conductor 110c. In some examples, the first insulator 110a may have a top portion (e.g., adjacent to the contact structures 104/106) or side portions (e.g., second insulators 110b) that are compositionally different from one another and/or may have different thicknesses and/or be formed separately. In one example, one of a top portion of the first insulator 110a or second insulators 110b may include a high-k dielectric material (e.g., hafnium oxide) or a high-k material with a transition layer (e.g., hafnium oxide and silicon dioxide), or other suitable material that provides a desired etch selectivity when performing the angled etch, as will be appreciated in light of this disclosure. While many of the examples described herein are focused on structures that include distinct layers of the first insulator 110a and second insulator 110b, it will be appreciated that the techniques and description here are equally applicable to a compositionally uniform, single first insulator 110a.

The second contact structure 106, unlike the first contact structure 104, includes an angled local interconnect portion (indicated in figures by a dashed oval) that connects the corresponding source/drain region 102 to an adjacent conductor 110c. As will be appreciated, the conductor 110c is at the device level (e.g., at a same level as the source/drain regions 102) and not above the device level (e.g., at a level above the source/drain regions 102 that also includes vias and/or metal lines). In this way, the second contact structure 106 functions as a "local interconnect" with the advantages and benefits indicated above.

The angled local interconnect portion of the second contact structure 106 is formed by first exposing the isolation wall structure 110 (and any surrounding layers) to a directional etch prior to formation of the contact structure 106. This directional etch is performed parallel to the gate (not shown) in a region that originates from (or near) source or drain region 102 and extends to the isolation wall structure 110. In some cases, this "downward" etch can also be directed to have a diagonal component, thus forming the diagonal leading edge of the first insulator 110a and the second insulator 110b (shown in the cross-sectional profile of FIG. 1a). The directional etch exposes a portion of the conductor 110c, thus enabling local between the conductor 110c and the second contact structure 106 at the device level.

In examples in which a diagonal or angled etch is used, techniques for performing this diagonal or angled directional etch include, but are not limited to, selective chemical etching, ion milling or implant sputtering, or dry/plasma etching. In one example embodiment, a photolithographic mask will be patterned so as to expose the portion of the isolation wall structure (or other structure) to be etched. In some examples, the sputtering implant beam can be rastered over the entire surface of a substrate or the directionally applied etchant may be applied across an entire surface of the substrate so as to etch or sputter portions of structures not covered by a patterned mask. In other examples, the etchant is uniformly and simultaneously applied to the entire surface of a substrate to etch portions of structures not covered by a patterned mask. An ion source generates an ion beam directed at an angle A of incidence within any of the following ranges and measured according to the scheme indicated in the figure: from 15° to 75°; from 25° to 65°; from 30° to 60°; from 40° to 50°. It will be appreciated that similar angles of incidence measured in an analogous way can be applied to any of the following examples. A magnetic field may be used to focus any charged particles and/or charge carriers generated as part of this process. The beam current and voltage may be independently controlled to obtain the desired ion energy (expressed in electron-Volts) and/or beam current density (expressed in Amperes/cm$^2$). Any suitable ion energy and beam current density may be employed considering the materials employed in the fabrication. For example, in a sputtering beam, e15/cm$^2$ to e17/cm$^2$ doses may be employed, according to some specific embodiments, to remove the above-indicated portion of the first insulator 110a and/or the second insulator 110b left exposed by the mask. Other techniques may also be used to remove material as described above so as to create the angled local interconnect portion. For example, accelerated ions can bombard the surface of the first insulator 110a left exposed by a correspondingly patterned photolithographic mask, and by this bombardment remove atoms and/or molecules of the first insulator 110a until the conductor 110c is exposed. In any of these example techniques, the rate and extent to which material is removed can be precisely controlled via the accelerating voltage and the flow rate of a gas used to form ions (also measured as current). These factors also control the moment of the incident ionized particles, which controls the selectivity of the species removed. In some embodiments, the angled etch process may also remove a portion of the conductor region 110c.

Various other techniques may also be used in combination with the subtractive techniques described above so as control the angle formed during ion milling, sputtering, dry etching (or other technique) during removal of a portion of the first insulator 110a and/or second insulator 110b. For example, the integrated circuit structure being etched may be mounted on a rotating stage assembly to allow for axis of rotation control that can be used to control, in part, an angle of incidence of an ion beam. Alternatively, one or more articulable mirrors may be employed to achieve the desired angle of incidence of an etchant (e.g., an ion beam).

While the angle of the angled portion shown in FIG. 1a (and other figures) is 45° it will be appreciated that the angle formed may be any suitable angle in the range of from 10° to 80° or from 15° to 75°. The value of the angle selected can be influenced by factors that include, but are not limited to, an angle used to expose a desired area of the conductor 110c that is sufficient to provide desired electrical characteristics (e.g., resistance, signal integrity). The angled sidewall can be in both the vertical and horizontal directions having dimensions within any of the following ranges: from 0.5 nm to 1 nm; from 0.75 nm to 1.5 nm; from 1 nm to 3 nm; greater than 2 nm.

Once the conductor 110c is exposed, deposition of material used to form the contact structure 106 can be performed using any of the techniques and materials described above. The material of the contact structure 106 deposits in the region formerly occupied by one or more of the first insulator 110a and the second insulator 110b removed by the directional etch. This forms the local interconnect portion indicated in FIG. 1a and establishes local electrical contact between the contact structure 106 and the conductor 110c.

Figure 1B:
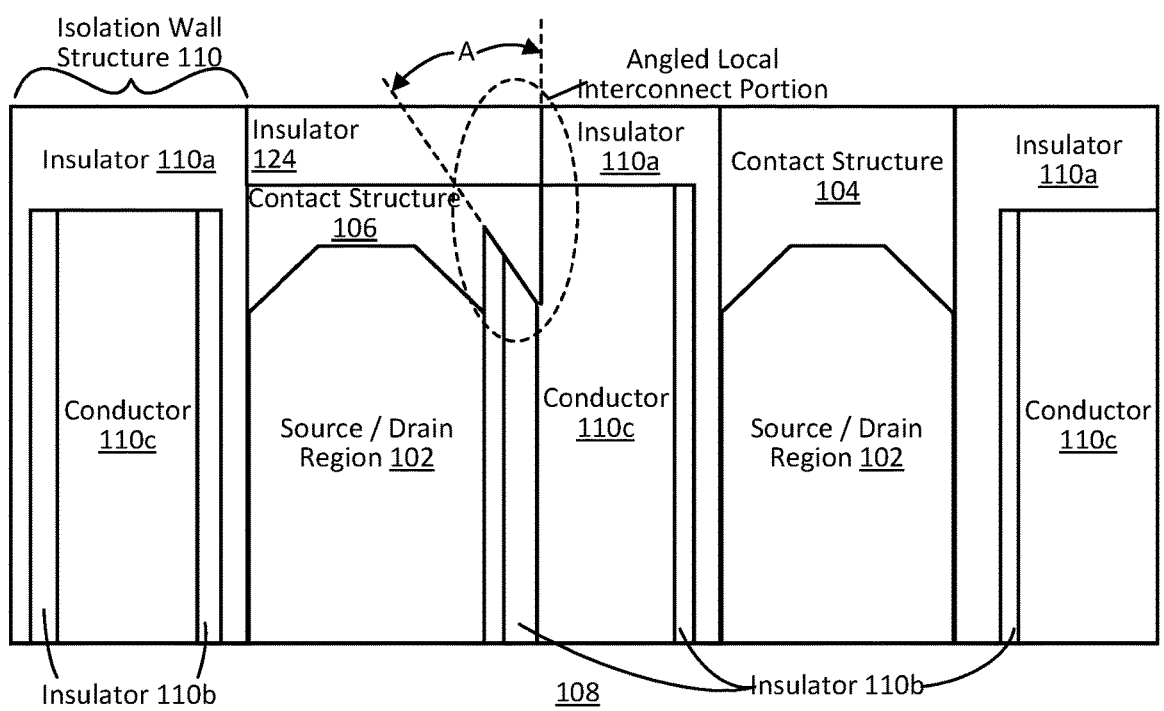
FIG. 1b illustrates a cross-section view, taken through the source/drain regions and parallel to a gate structure, of an integrated circuit structure that includes an angled local interconnect that extends laterally from a source or drain contact structure to a conductor in an isolation wall, in accordance with another embodiment of the present disclosure.

FIG. 1b illustrates a cross-sectional view of an integrated circuit (IC) structure 108 taken through the source/drain regions and parallel to a gate structure. Many of the elements present in the IC structure 108 have been described above in the context of the IC structure 100 and need no further explanation.

In part, FIG. 1b is provided to illustrate that the angled local interconnect portion can be in any orientation relative to surrounding structures (e.g., relative to first contact structure 104, second contact structure 106, and isolation wall structure 110). As shown, FIG. 1b is on a side of the second contact structure 106 opposite that of the side depicted in FIG. 1a. Furthermore, the IC structure 108 includes a second contact structure 106 that is thinner (e.g., as measured from a proximate surface of the source/drain region 102) relative to the example second contact shown in FIG. 1a. This thinner second contact structure 106 can accommodate a layer thereon, such as third insulator 124 as shown in FIG. 1b.

Figure 1C:
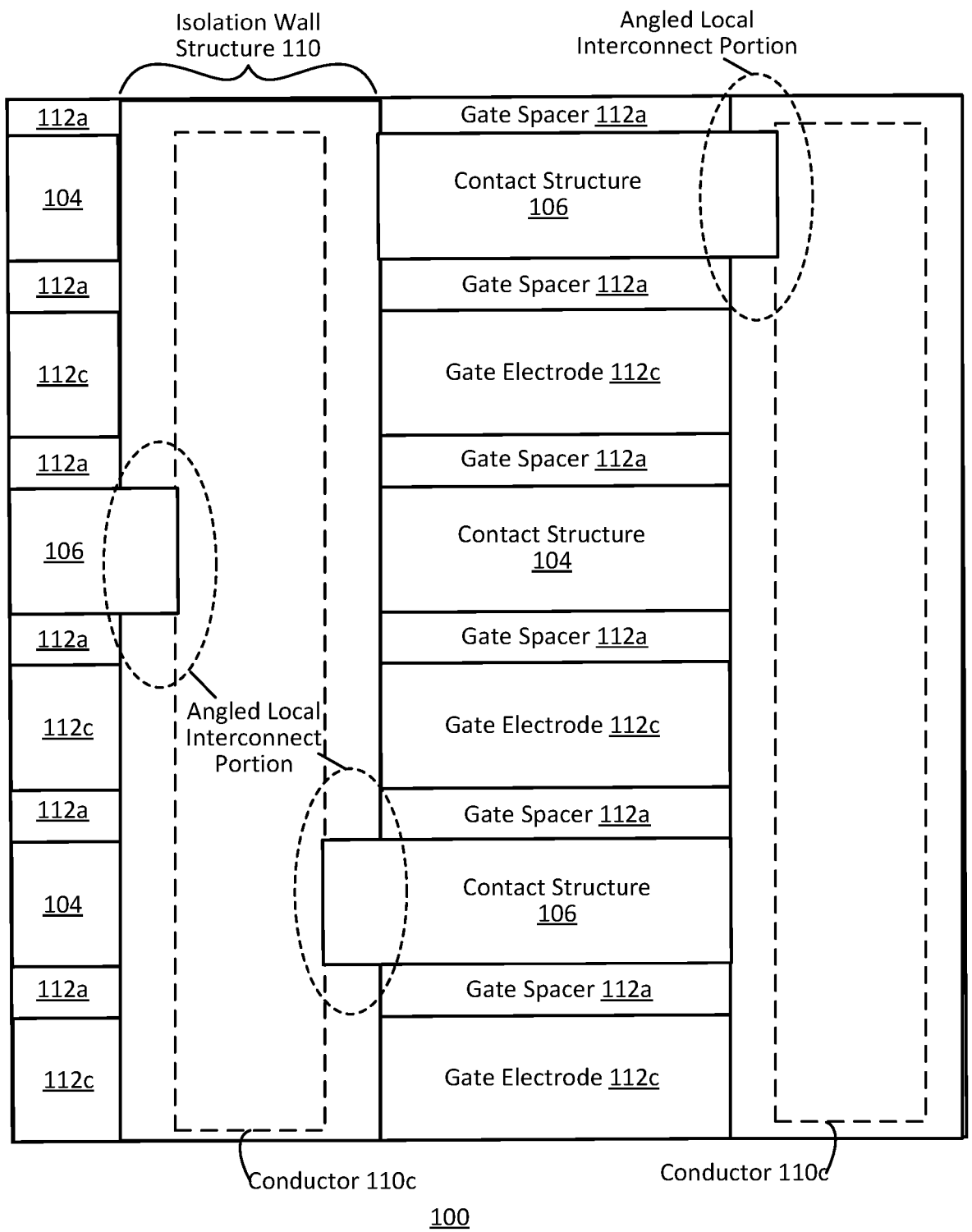
FIG. 1c illustrates a plan view cross-section view of an integrated circuit, including angled local interconnects that extend laterally from source and/or drain contact structures to conductors within isolation wall structures, in accordance with an embodiment of the present disclosure such as the ones shown in FIGS. 1a-1b.

FIG. 1c illustrates a plan view cross-section of the example IC 100 from the perspective indicated in FIG. 1a. FIG. 1c illustrates the connection between second contacts 106 and the conductor 110c to provide local interconnection from source/drain regions to neighboring conductive structures without extending beyond the device level, as described above. As can be seen, a top portion of the contact structure 106 extends beyond an outer perimeter of gate spacer 112a and gate electrode 112c and extends over an outer perimeter of isolation wall structure 110. As will be appreciated upon reference to FIGS. 1a, 1b, the lateral extension of the second contact structure 106 into the isolation wall structure 110 results in contact between the angled local interconnect portion of the second contact structure 106 and the conductor 110c within the isolation wall structure 110 (as described above).

Figure 2A:
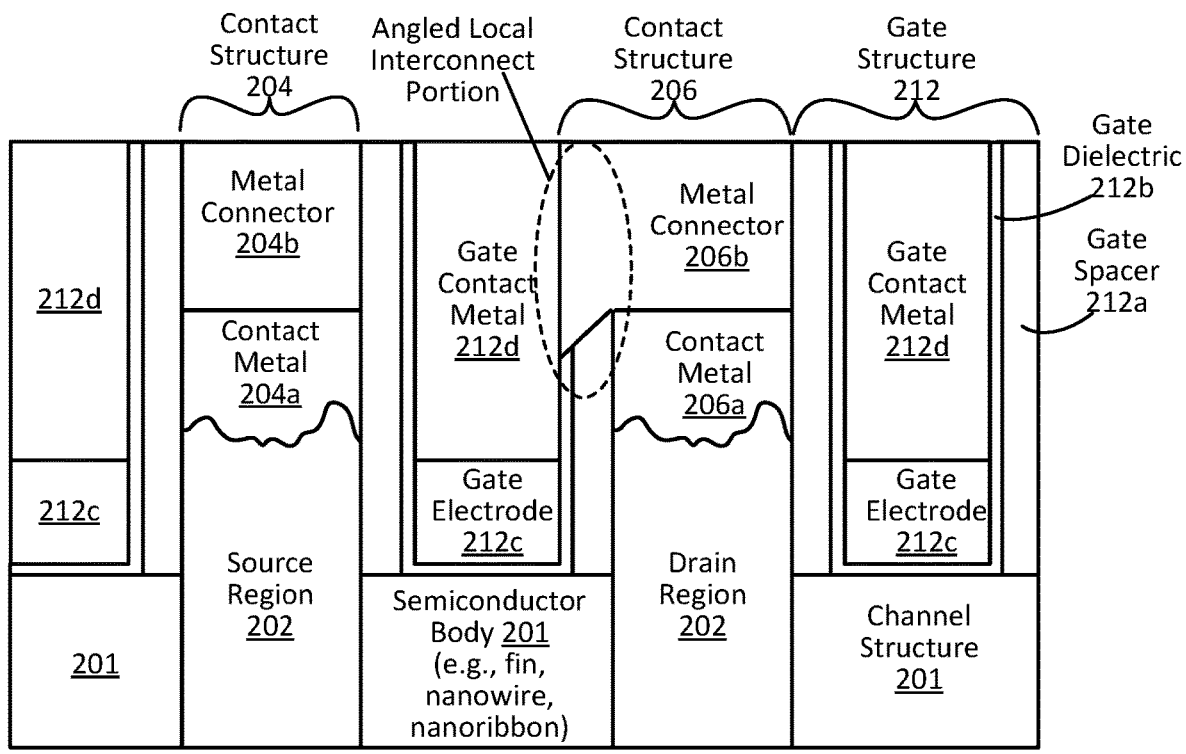
FIG. 2a illustrates a cross-section view, taken through the channel region and perpendicular to a gate structure, of an integrated circuit structure that includes an angled local interconnect that extends laterally from a drain contact structure to the gate structure, in accordance with an embodiment of the present disclosure.

FIG. 2a illustrates a cross-section view, taken through the channel and perpendicular to the gate, of an integrated circuit (IC) structure 200. The example IC structure 200 includes a semiconductor body (e.g., a fin, a nanowire, a nanoribbon) 201, source and drain regions 202, a first contact structure 204, a second contact structure 206, and a gate structure 212 that includes a gate spacer 212a, a gate dielectric 212b, a gate electrode 212c, and a gate contact metal 212d. The compositions and techniques used to form these various elements of the IC structure 200 have been described above.

The example IC structure 200 is provided to illustrate that an angled local interconnect portion can be associated with different conductive structures and connect a wide variety of components of a semiconductor device at the device level. The example IC structure 200 includes an angled local interconnect portion as a component of the second contact structure 206 that provides local connection between, in this example, the drain region 202 and the gate contact metal 212d. As with the preceding examples, the angled local interconnect portion connects these elements of the IC structure 200 at the device layer and not above the device layer.

Unlike the examples described above, which include an angled local interconnect portion between a source/drain region contact structure 106 and a conductor 110c within an isolation wall structure 110, the example IC structure 200 is shown having a metal connector 206b over contact metal layer 206a that connects the drain region 202 and the gate contact metal 212d via the angled local interconnect portion. In other words, the angled local interconnect portion of the metal connector 206b is formed by removing a portion of the gate spacer 212a and gate dielectric 212b to expose the gate contact metal 212d, prior to forming the metal connector 206b. In this configuration, angled local interconnect portion passes over the portions of the gate spacer 212a and gate dielectric 212b remaining after application of the angled etch.

Figure 2B:
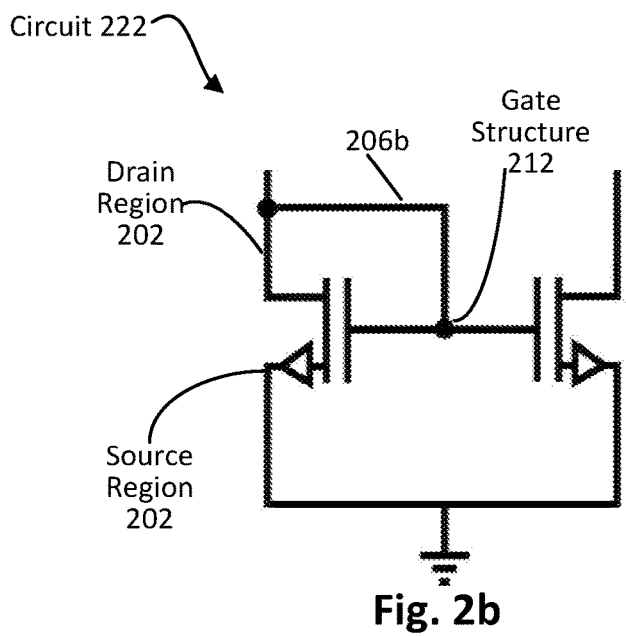
FIG. 2b illustrates an example schematic circuit diagram of an integrated circuit structure, such as the one of FIG. 2a, in accordance with an embodiment of the present disclosure.

FIG. 2b is a circuit diagram 222 of the example IC structure, in accordance with an embodiment of the present disclosure. As shown the drain region 202 of one of the transistor devices is connected to the gate structure 212 using an internal angled local interconnect of the metal connector 206b, in accordance with an embodiment of the present disclosure.

Figure 2C:
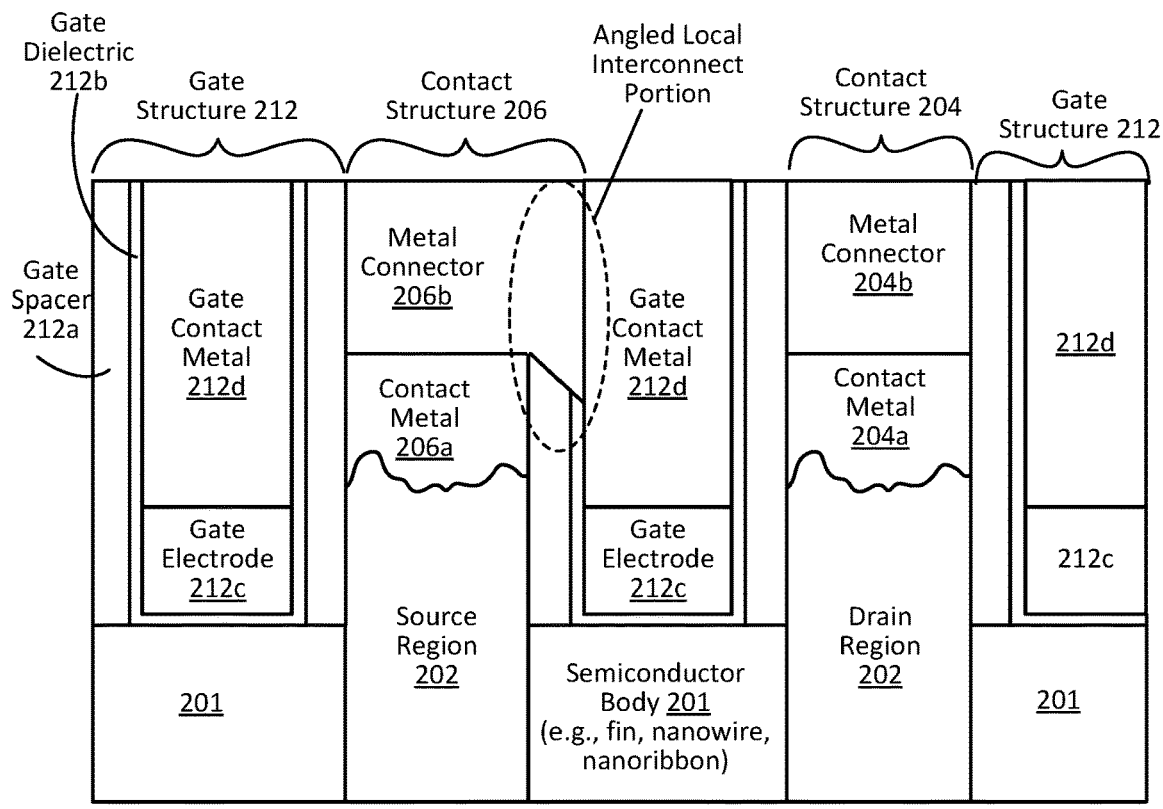
FIG. 2c illustrates a cross-section view, taken through the channel region and perpendicular to a gate structure, of an integrated circuit structure that includes an angled local interconnect that extends laterally from a source contact structure to the gate structure, in accordance with another embodiment of the present disclosure.

FIG. 2c illustrates a cross-section view, taken through the channel and perpendicular to the gate, of an integrated circuit (IC) structure 207. The example IC structure 207 includes a semiconductor body (e.g., a fin, a nanowire, a nanoribbon) 201, source and drain regions 202, a first contact structure 204, a second contact structure 206, and a gate structure 212 that includes a gate spacer 212a, a gate dielectric 212b, a gate electrode 212c, and a gate contact metal 212d. The compositions and techniques used to form these various elements of the IC structure 207 have been described above.

Much like FIG. 2b, FIG. 2c is provided to illustrate the diversity of configurations that are capable when establishing connections between adjacent structures at the device level using an angled local interconnect portion. In the example IC structure 207, a local angled interconnect portion is associated with (and in some cases, integral with) a metal connector layer 206b over the contact metal 206a associate with the source region 202. This local angled interconnect portion establishes contact with gate contact metal 212d over the semiconductor body 201.

Figure 2D:
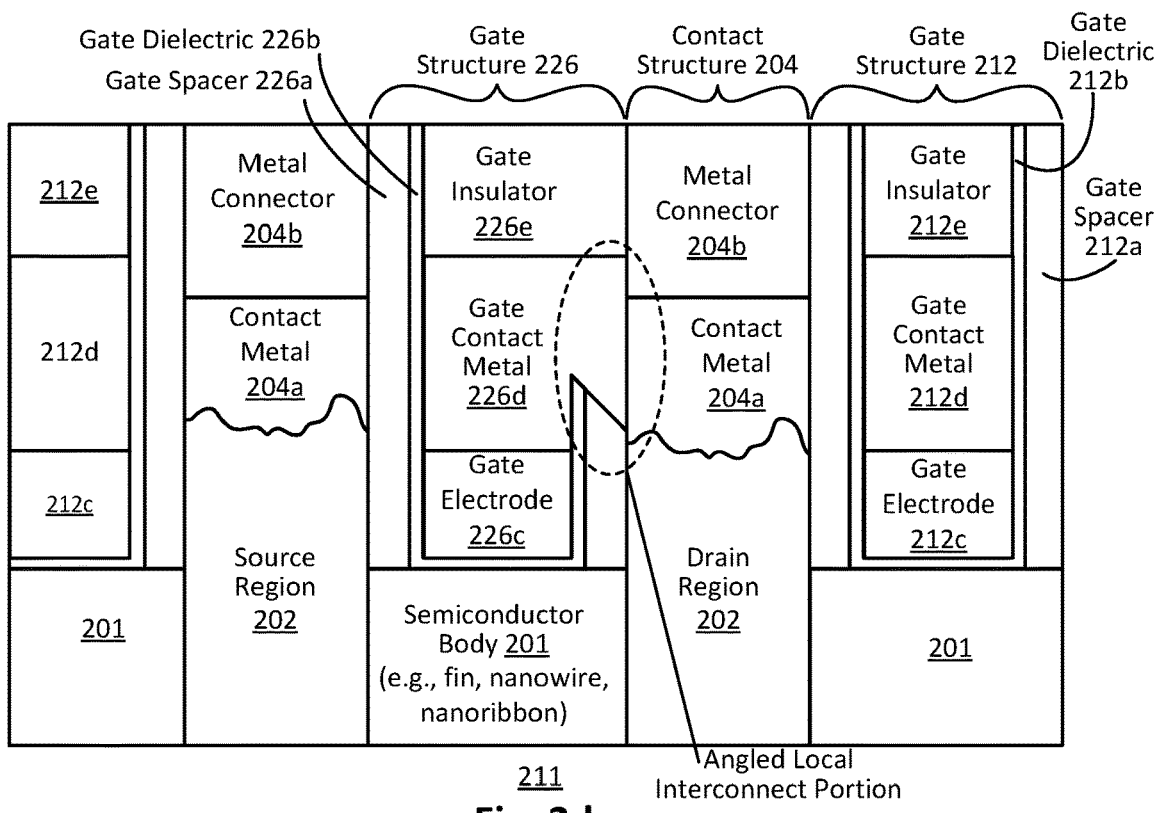
FIG. 2d illustrates a cross-section view, taken through the channel region and perpendicular to a gate structure, that includes an angled local interconnect that extends laterally from a gate structure to a drain contact structure, in accordance with another embodiment of the present disclosure.

FIG. 2d is also provided to illustrate the diversity of configurations that are possible in various embodiments of the present disclosure. In the example IC structure 211, a local angled interconnect portion is associated with (and in some cases, integral with) a gate contact metal layer 226d over the gate electrode 226c. This local angled interconnect portion establishes contact with both of contact metal 204a and the metal connector 204b over the drain region 202. Furthermore, similar to the configuration shown in FIG. 1b, the gate contact metal 226d is disposed between a gate insulator layer 226e and a gate electrode layer 226c.

Figure 2E:
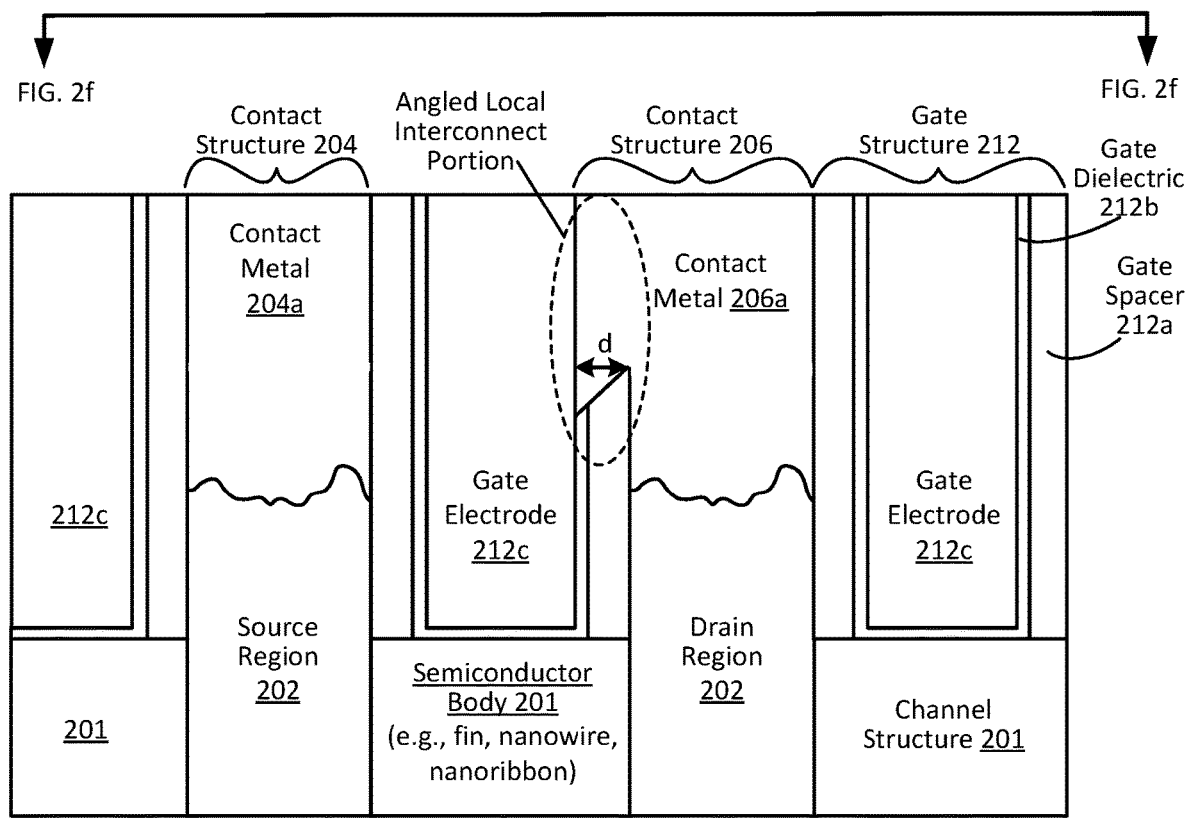
FIG. 2e illustrates a cross-section view, taken through the channel region and perpendicular to a gate structure, of an integrated circuit structure that includes an internal, angled local interconnect that extends laterally from a drain contact structure to a gate structure, in accordance with another embodiment of the present disclosure.

FIG. 2e is yet another embodiment illustration of the variation in configurations that are possible in various embodiments of the present disclosure. As shown, the angled local interconnect m portion is associated with the second contact structure 206, and more specifically the contact metal 206a, and extends leftward in the reference frame of the figure to contact the gate electrode 212c. In this way, the angled local interconnect portion extends over a remaining portion a gate spacer 212a and a gate dielectric layer 212b.

Figure 2F:
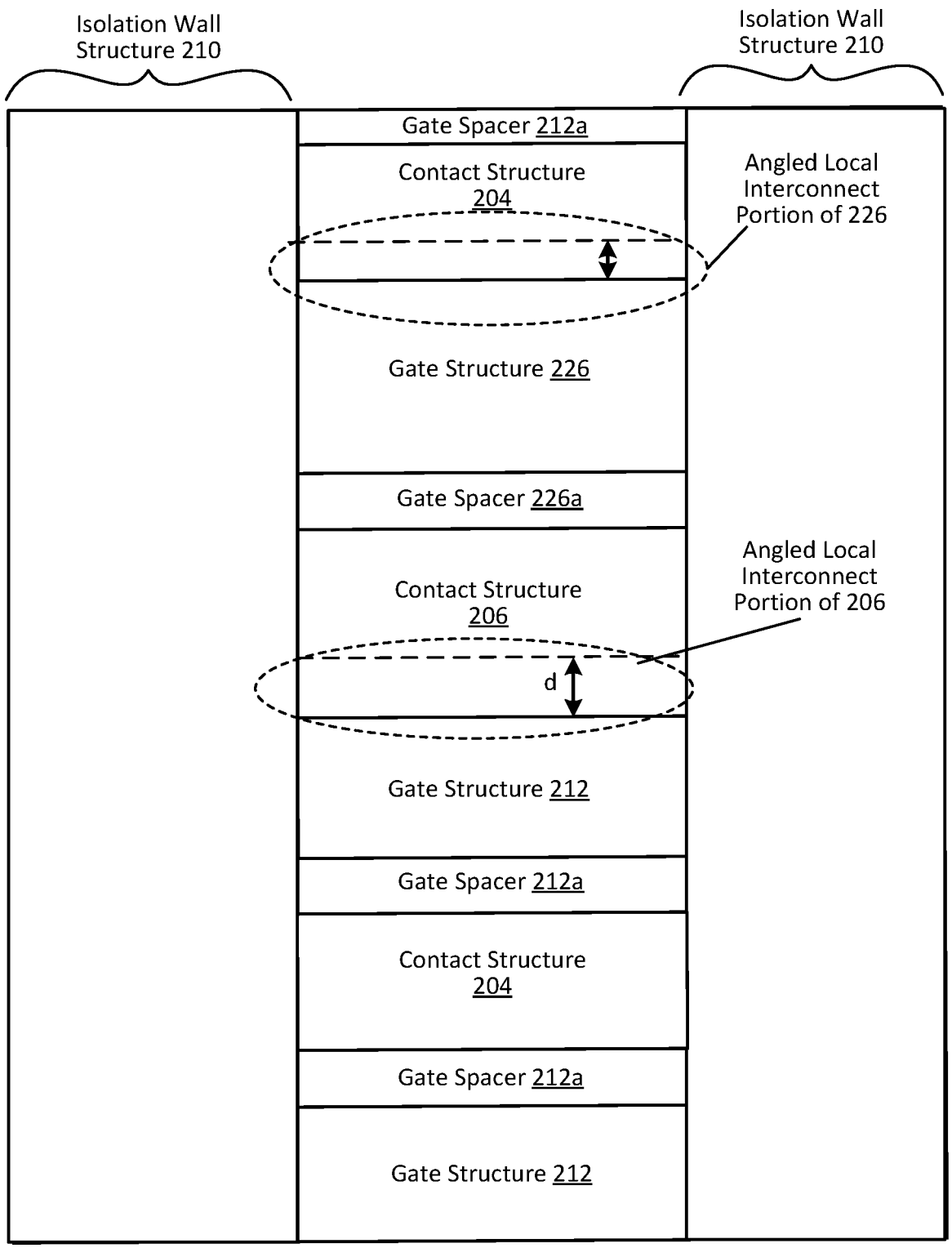
FIG. 2f illustrates a plan view cross-section view of an integrated circuit, including angled local interconnects that extend laterally between gate structures and source or drain contact structures, in accordance with an embodiment of the present disclosure such as the ones shown in FIGS. 2a-2e.

FIG. 2f illustrates a plan view cross-section of the example IC 213 from the perspective indicated in FIG. 2e. FIG. 2f illustrates the connection between second contact structures 206 and gate structures 212, 226c to provide local interconnection from drain regions (and/or optionally source regions) to neighboring transistors without extending beyond the device level, as described above. As can be seen, a top portion of the contact structures 206 extends a distance d (also indicated in FIG. 2e) beyond an outer perimeter of a drain region 202 (shown in FIG. 2e) to extend over gate spacer 212a and gate dielectric 212b. As will be appreciated, this configuration results in contact between angled local interconnect portion of the second contact structure 206 and the gate electrode 212c, previously exposed by an etch (as described above). A gate structure 226 is also shown in this view as included an angled local interconnect portion that connects to an adjacent contract structure 204. Isolation wall structures 210 are also illustrated in this view.

Figure 3:
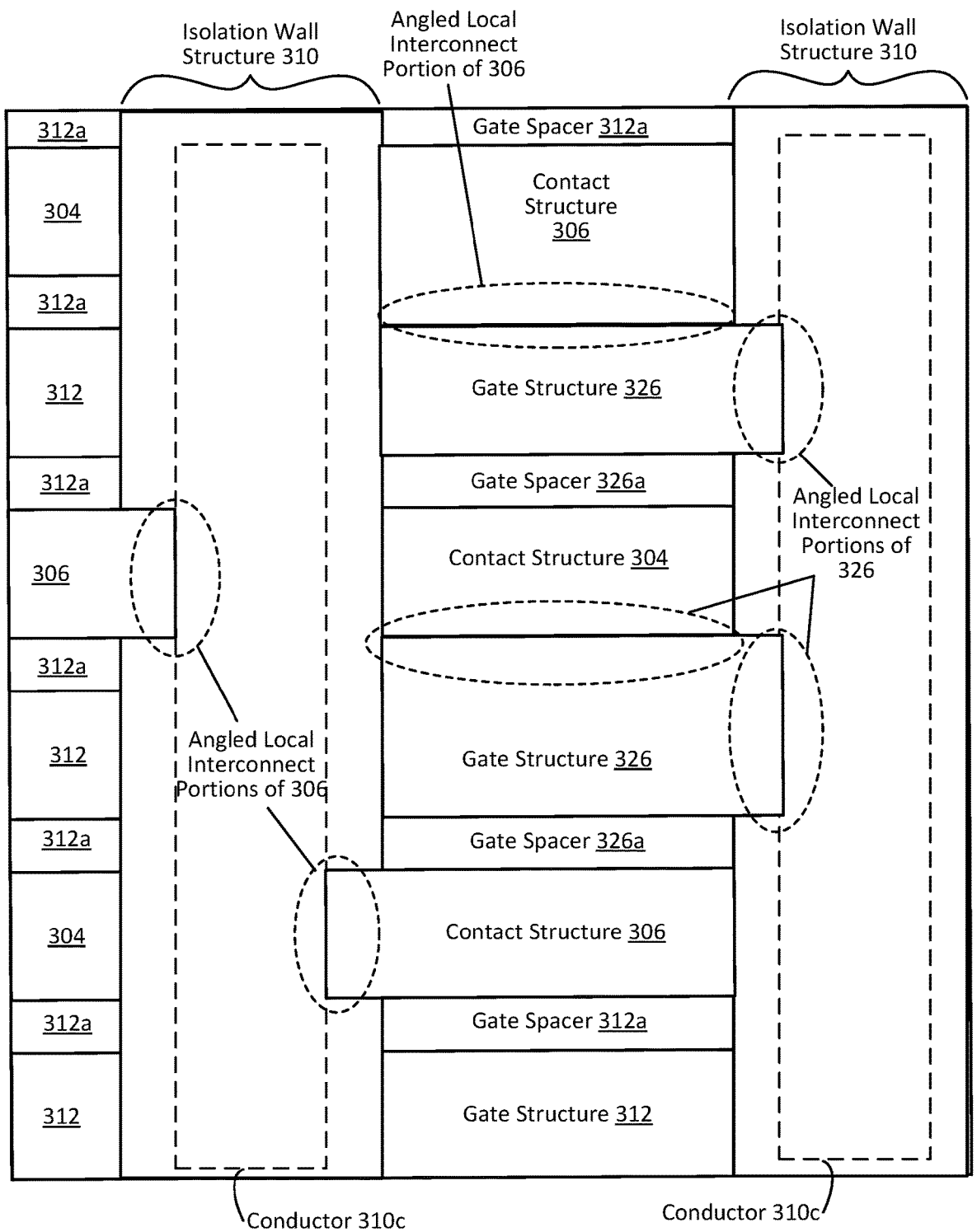
FIG. 3 illustrates a plan view cross-section view of an integrated circuit, including angled local interconnects that extend laterally both between gate structures and source/drain contact structures as well as between source/drain/gate structures and conductors within isolation wall structures, in accordance with an embodiment of the present disclosure such as the ones shown in FIGS. 1a-c and 2a-2f.

FIG. 3 illustrates a plan view cross-section of an example IC 300 that includes multiple angled interconnect portion that establish connections between different types of conductive structures within the example IC 300. In this example, the device level interconnects established are between source/drain and gate and between source/drain/gate, and a conductor within an isolation wall. As shown, gate structure 326 (which can include gate spacers 326a) includes two angled local interconnect portions—one corresponding to the gate structure 326 itself and establishing a connection to conductor 310 within isolation wall structure 310 and another corresponding to the contact structure 306 and establishing contact between the gate structure 326 and a source/drain region 306.

Methodology

Figure 4A:
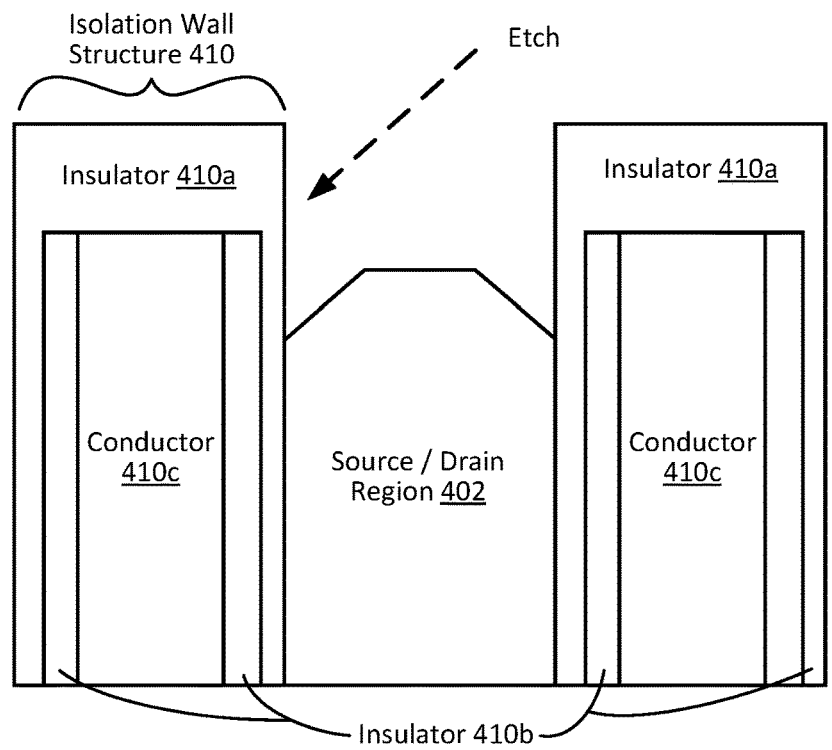
FIG. 4a-4c illustrate an example process of forming an angled local interconnect to connect a source/drain contact structure with a conductor within an isolation wall structure, in accordance with an embodiment of the present disclosure.

FIGS. 4a-5d illustrate various example structures as progressively fabricated, according to some embodiments of the present disclosure. Turning first to FIGS. 4a and 4b, an IC structure 400 similar to those shown in FIGS. 1a and 1b is illustrated. At this stage of fabrication, the IC structure 400 includes source/drain region 402 and isolation wall structures 410, which include insulator layers 410a, 410b, and conductor 410c. These elements have been described above in the context of other figures.

As shown in this figure, and as described above, the IC structure 400 is exposed to some form of angled, directional etch process, whether sputtering, ion milling, plasma/dry etching, or a wet chemical etch. In the example shown, the angled, directional etch process is that of a beam associated with any one of sputtering, ion milling, or plasma/dry etching. This directional etch removes portions of the source/drain region 402 and a portion of a sidewall of the isolation wall structure 410

Figure 4B:
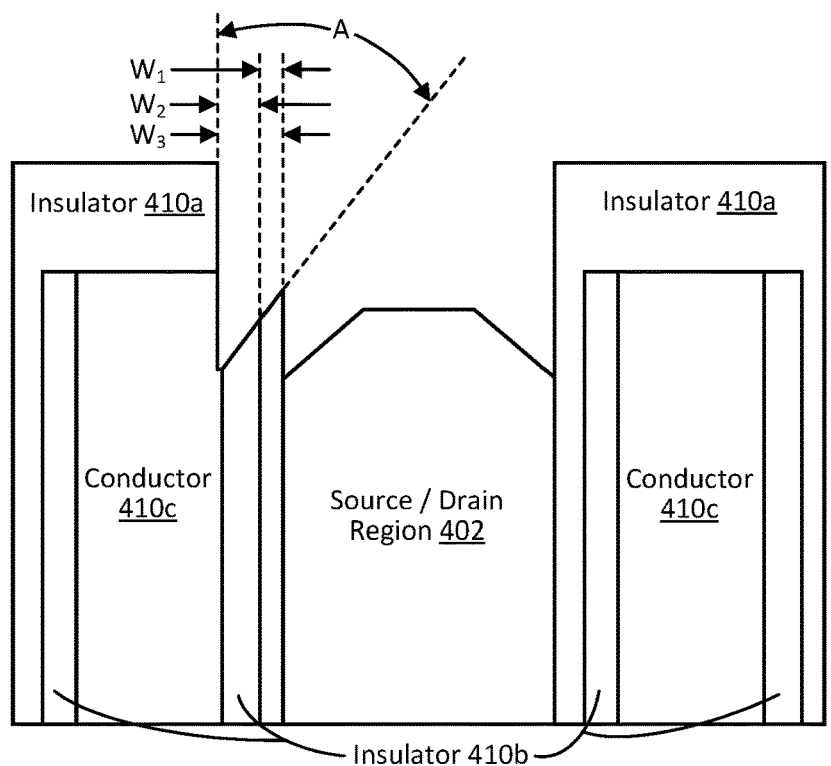

FIG. 4b illustrates the removal of a portion of the isolation wall structure 410 and more specifically portions of the insulator 410a and insulator 410b to expose a corresponding portion of the conductor 410c. As described above, an angle A (shown in FIG. 4b) can be within any of the following ranges: from 30° to 60°; from 30° to 50°; from 40° to 50°; from 45° to 60°. Also indicated in FIG. 4b are thicknesses of insulator layers 410b (thickness $W_1$) and 410c (thickness $W_2$), as well as the sidewall thickness of the insulator 410a that is an approximate of the individual layers 410b and 410c (thickness $W_3$). Thickness $W_1$ can be within any of the following ranges: from 0.5 nm to 1 nm; from 0.75 nm to 1.5 nm; from 1 nm to 3 nm; greater than 2 nm. Thickness $W_2$ can be within any of the following ranges: from 0.5 nm to 1 nm; from 0.75 nm to 1.5 nm; from 1 nm to 3 nm; greater than 2 nm. Thickness $W_3$ can be within any of the following ranges: from 1.5 nm to 3 nm; from 0.75 nm to 5 nm; from 1 nm to 5 nm; greater than 3 nm.

Figure 4C:
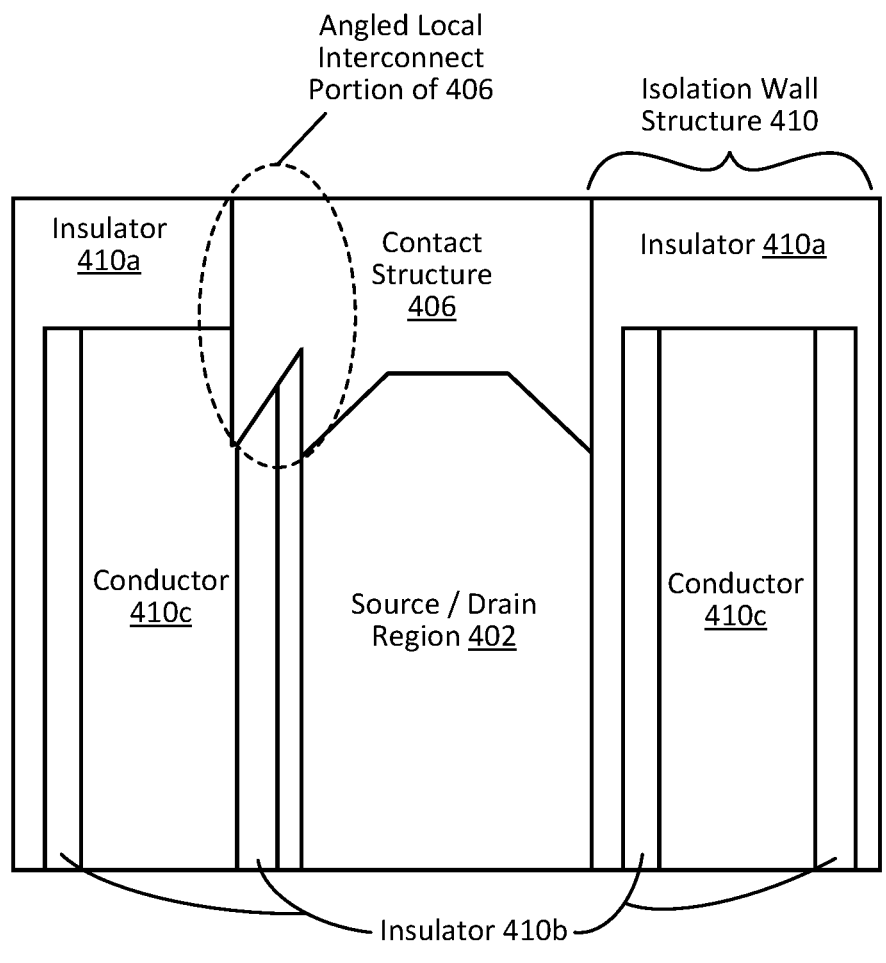

FIG. 4c illustrates the example IC structure 400 after formation of the contact structure 406. As described above, formation of the contact structure 406 simultaneously forms the angled local interconnect portion of the contact structure 406 that places the conductor 410c in electrical contact with the contact structure 406, and thus the source/drain region 402.

Figure 5A:
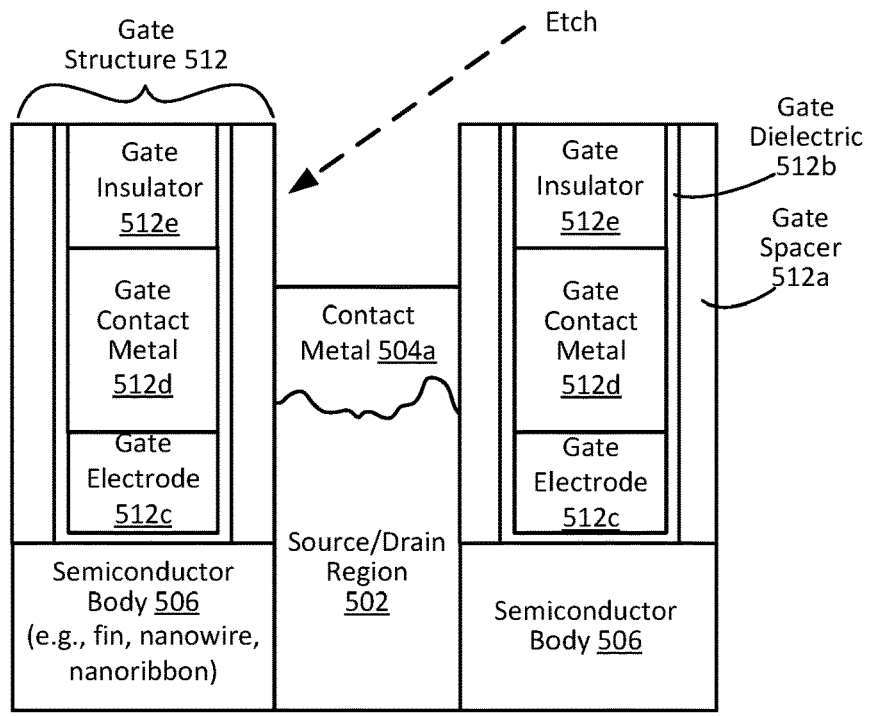
FIG. 5a-5d illustrate an example process of forming an angled local interconnect to connect a gate contact structure to a source/drain contact structure, in accordance with another embodiment of the present disclosure.
Figure 5B:
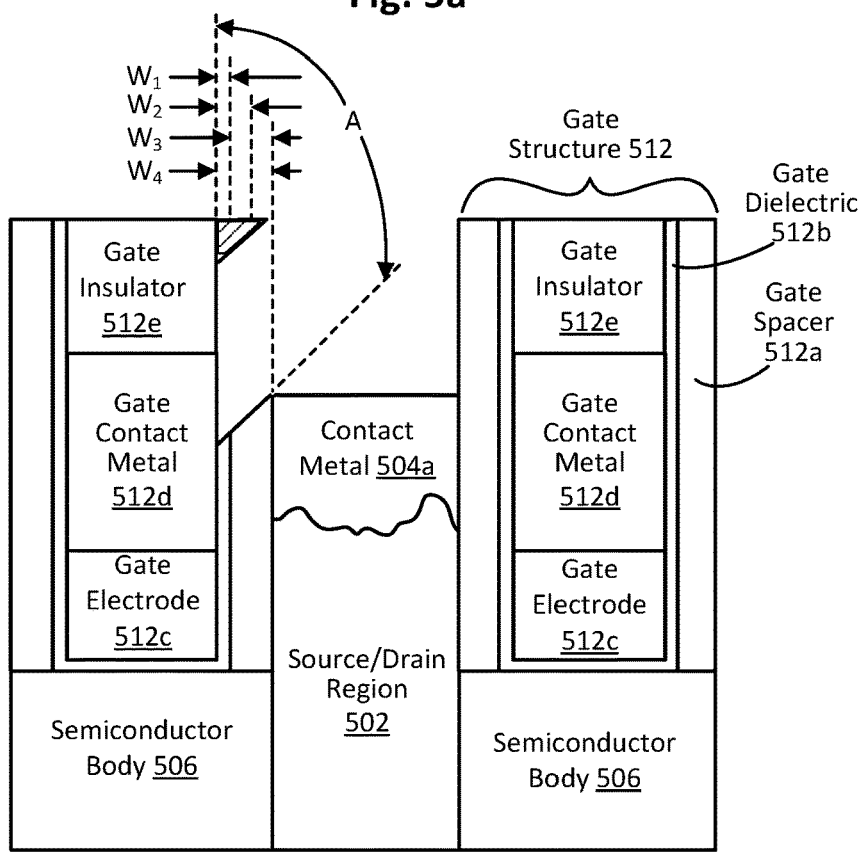

FIGS. 5a and 5b illustrate a situation similar to that depicted in FIG. 4a, the primary difference being exposure of a different structure within an example IC device 500 to the etchant. Turning first to FIG. 5a, the example IC device 500 includes a source/drain region 502 between semiconductor bodies 506. Over the source/drain region 502 is a metal contact 504a. Over the semiconductor bodies 506 are corresponding gate structures 512, latter of which include the gate electrode 512c, a gate contact metal 512d, and the gate insulator 512e.

Analogous to the description of FIGS. 4a and 4b, a sidewall of the gate structure 512, and more specifically a sidewall that includes a portion of the gate spacer 512a and the gate dielectric layer 512b is exposed to a directional etch. FIG. 5b illustrates the removal of a portion of the gate structure 512 and more specifically portions of the gate spacer 512a and gate dielectric 512b to expose portions of the gate contact metal 512d and the gate insulator 512e. As with any of preceding examples, a mask is used to protect structures not intended to be etched. The mask is omitted from the figures for clarity of depiction, but it will be appreciated that any protective mask will cover the depicted structures except for those to be etched. The etchant beam can be provided an incident angle A (shown in FIG. 5b) and can be within any of the following ranges: from 30° m to 60°; from 30° to 50°; from 40° to 50°; from 45° to 60°. Also indicated in FIG. 5b are thicknesses of the gate dielectric 512b (thickness $W_1$), the gate spacer 512a (thickness $W_3$), as well as the sidewall thickness of both of these together (thickness $W_4$). In some cases, a remnant portion of the gate structure 512 sidewall insulation layers may be present after the etch. This "remnant portion" (or simply "remnant") has a thickness that is indicated by $W_3$. It will be appreciated that in some examples the remnant portion may be present due to natural process variation, a deviation in the processing conditions (e.g., a compositional variation the materials being removed, a mask error, a fluctuation in etchant power), or a re-formation of material previously etched. Regardless of the mechanism by which the remnant portion forms, its formation means that, after the angled local interconnect is formed, portions of the insulator are both above and below the angled local interconnect portion.

Thickness $W_1$ can be within any of the following ranges: from 0.5 nm to 1 nm; from 0.75 nm to 1.5 nm; from 1 nm to 3 nm; greater than 2 nm. Thickness $W_2$ can be within any of the following ranges: from 0.5 nm to 1 nm; from 0.75 nm to 1.5 nm; from 1 nm to 3 nm; greater than 2 nm. Thickness $W_3$ can be within any of the following ranges: from 0.5 nm to 1 nm; from 0.75 nm to 1.5 nm; from 1 nm to 3 nm; greater than 2 nm. Thickness $W_4$ can be within any of the following ranges: from 1.5 nm to 3 nm; from 0.75 nm to 5 nm; from 1 nm to 5 nm; greater than 3 nm.

Figure 5C:
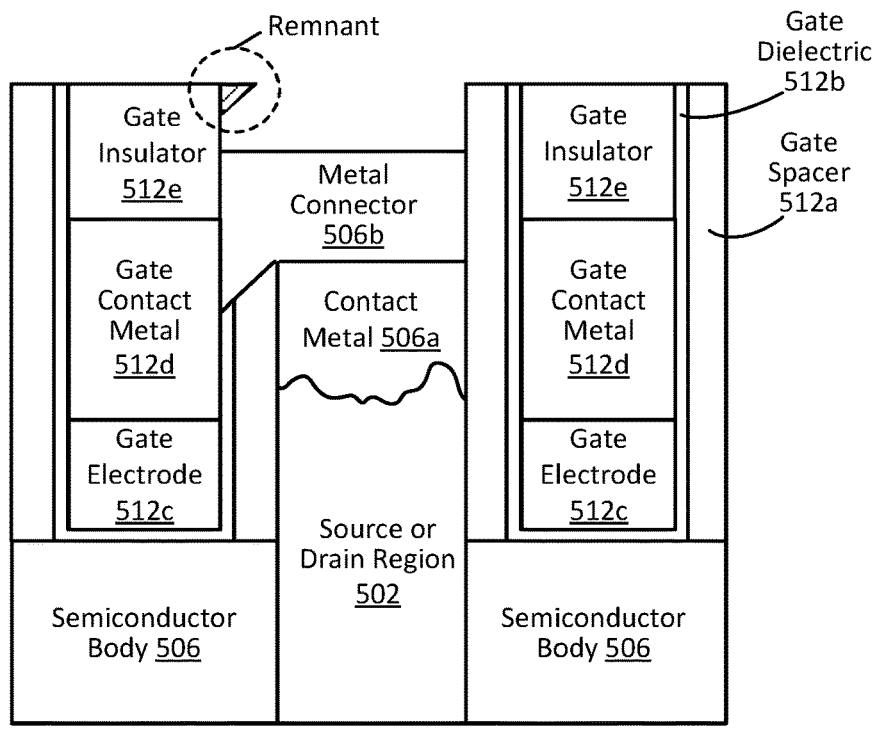

FIG. 5c illustrates deposition of a metal connector 506b having an angled local interconnect portion that establishes contact between the contact metal 506a and the gate metal contact 512d. The angled local interconnect portion also can, in this example, make (direct or indirect) physical contact with the gate insulator 512e over the gate contact metal 512d as well as (direct or indirect) physical contact with the top surfaces of the gate spacer 512a and gate dielectric layer 512b exposed by the etchant. Also note that the remnant, described above, remains present at this stage of processing.

Figure 5D:
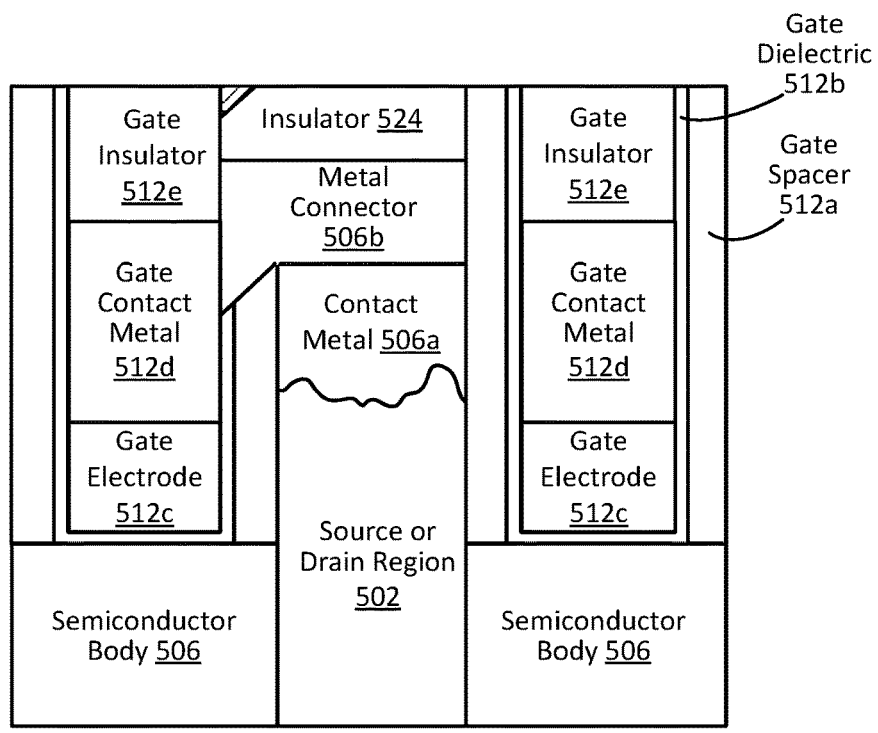

FIG. 5d illustrates the example IC structure 500 to which an insulator layer 524 is formed over or on the metal connector 506b. As shown in the insulator layer 524 forms conforms to the space over the metal connector 506B which includes conforming to the remnant portion that is salient from the gate insulator 512e.

Figure 6:
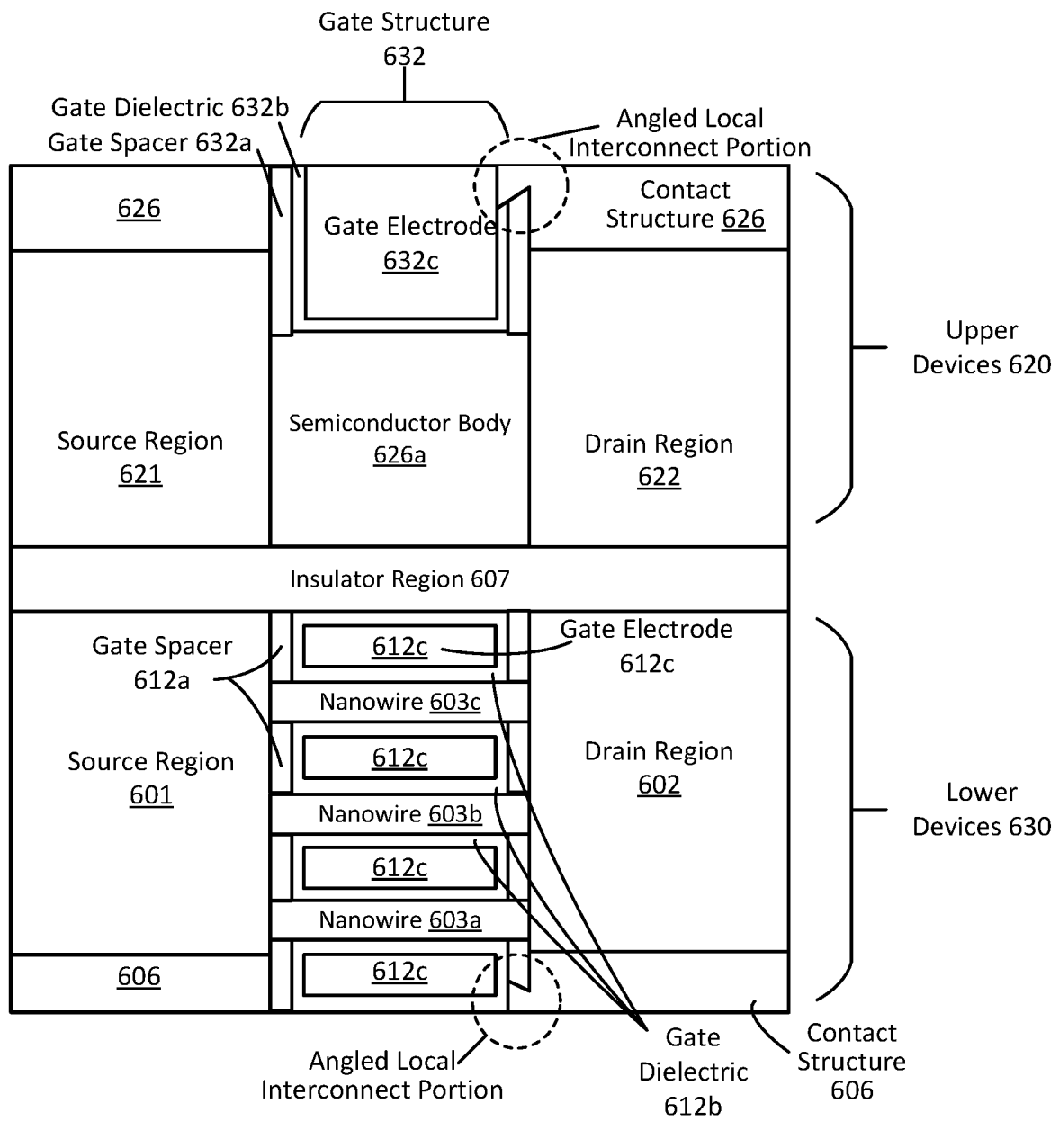
FIG. 6 shows a stacked transistor structure incorporating angled local interconnects that extend laterally between gate structures and source or drain contact structures, in accordance with another embodiment of the present disclosure.

FIG. 6 is in another embodiment that may include the angled local interconnect portions described above. The example IC 600 is a stacked integrated circuit in which an upper device 620 is stacked over lower devices 630, with an insulator region 607 disposed there between. The example IC 600 also illustrates different device types that can benefit from inclusion of an angled local interconnect portion. Specifically, the lower devices 630 are configured as "gate all around" or GAA devices (e.g., having a semiconductor body that is a nanoribbon or nanowire and that is encircled by a gate electrode structure). Despite this configuration differing from the examples depicted earlier, nevertheless GAA devices, among other types and configurations of semiconductor devices, can include an angled local interconnect portions as described herein.

The lower devices 630 include a source region 601, a drain region 602, contact structures 606, nanowires 603a, 603b, and 603c, and gate structures 612, which further include gate spacers 612a, gate dielectric layers 612b, and get electrodes 612c. On an opposing side of the insulator region 607 (which can be fabricated from any of the materials described above for use as insulator layers), the upper device 620 includes a source region 621, a drain region 622, a semiconductor body 626 disposed there between, source/drain contact structures 626, and gate structure 632, which further includes a gate spacer 632a, a gate dielectric layer 632b, and the gate electrode 632c.

As can be seen, the contact structure 606 and the lower device includes an angled local interconnect portion that establishes contact between the contact structure 606 and the gate electrode 612 C associated with the nanowires 603a.

Similarly, the upper device 620 includes an angled local interconnect portion that establishes contact between the contact structure 626 and the gate electrode.

Jogged Via

Figure 7A:
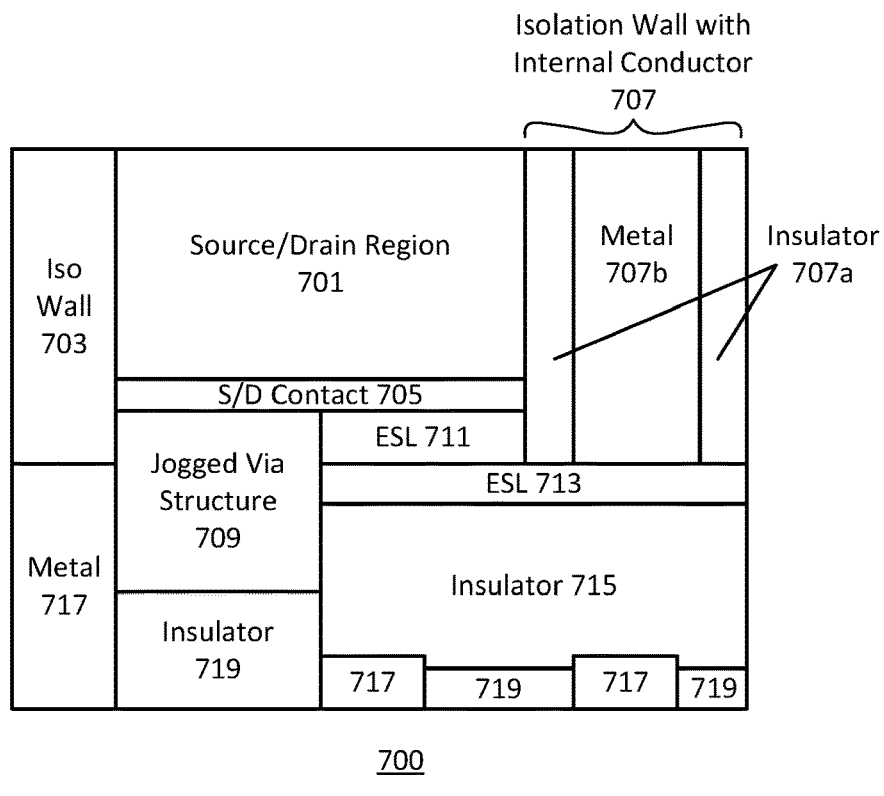
FIG. 7a illustrates a cross-section view, taken through the source/drain regions and parallel to a gate structure, of an integrated circuit structure including a jogged-via structure for connecting a source/drain contact structure to an adjacent metal conductor, in accordance with an embodiment of the present disclosure.
Figure 7B:
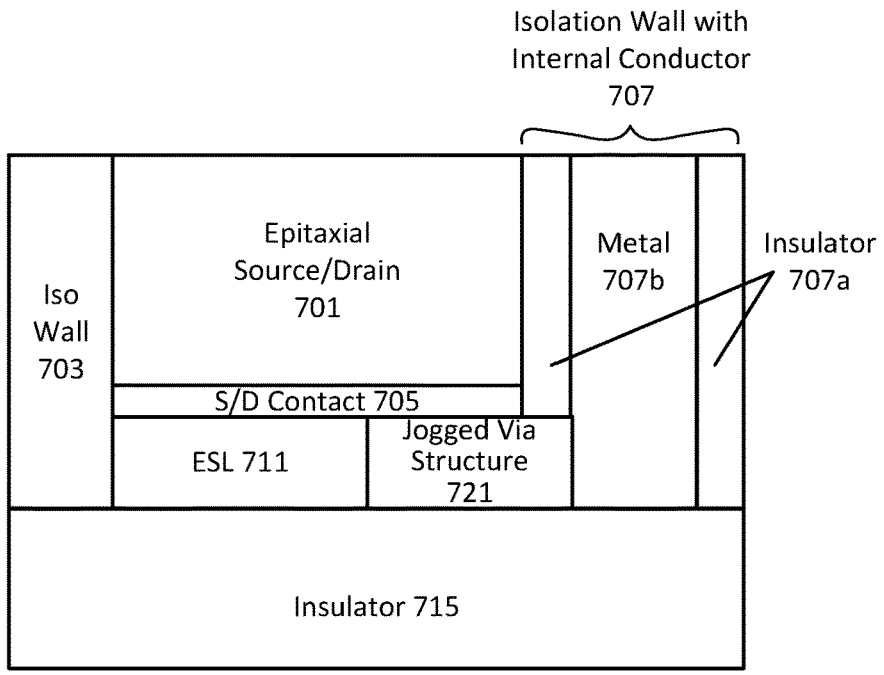
FIG. 7b illustrates a cross-section view, taken through the source/drain regions and parallel to a gate structure, of an integrated circuit structure including a jogged-via structure for connecting a source/drain contact structure to an adjacent metal conductor, in accordance with another embodiment of the present disclosure.

Another technique and architecture for interconnection within an integrated circuit is that of a "jogged via," examples of which are illustrated in FIGS. 7a and 7b. It will be appreciated that embodiments that include a jogged via can be used to establish electrical connection within an integrated circuit in which more traditional interconnect arrangements might be challenging. For example, as indicated above, under some circumstances interconnect structure alignment (e.g., between stacked vias, between a stacked via and a metal line) may a high degree of precisions—within only a few nanometers—to establish electrical connection. Using a jogged via such as is illustrated in FIGS. 7a and 7b establishes electrical connections on confronting peripheral surfaces for structures that are not necessarily coaxial or concentric. A terminal surface of the jogged via structure that is approximately orthogonal (e.g., at an angle of from 45° to 90°) to the peripheral surface can be in contact with or otherwise connect to a source/drain contact or other conductive structure. In some examples, these structures can be "self-aligned" (reducing the precision that would otherwise be needed to successfully pattern the via). This reduces the risk of poor electrical connection (and poor long term reliability caused by electromigration) from misalignment.

It will be appreciated that the examples shown in FIGS. 7a and 7b, described in more detail in the context of FIGS. 7a and 7b are shown as having been processed from the "back side" of the device. That is, a source/drain region (along with other structures) is grown or formed on a substrate, which is later removed. It will be appreciated that the architectures and methodologies described below can be adapted for "front side" processing.

Turning first to FIG. 7a, an example device 700 is depicted. The example device includes isolation wall 703, in isolation wall 707 that includes an internal conductor 707b within insulator layers 707a, a source/drain region 701, between the isolation wall 703 and the isolation wall 707, a source drain contact 705 on the source/drain region 701, etch stop layers (ESL) 711, 713, insulator layer 715, and conductive portions 717, and interspersed with dielectric material 719. Many of these features have been described above in the preceding descriptions are equally applicable to the example device 700. Furthermore, additional descriptions for many of these elements is presented below in the context of FIGS. 8a-8k which illustrate an example fabrication methodology.

As can be seen in FIG. 7a, a peripheral surface of jogged via structure 709 is adjacent to, and in electrical contact with, a confronting peripheral surface of metal structure 717. This "side-by-side" configuration can improve the ability to establish electrical connections between small interconnect features (e.g., a diameter or characteristic feature size of less than 10 nm), tightly spaced features (e.g., with center to center pitches of 10 nm or less), and/or align structures in densely populated regions of an IC, all of which can be difficult to photolithographically pattern.

FIG. 7b illustrates an alternative embodiment of a semiconductor device 702 that includes a jogged via. The device 702 includes electrical connection between a conductor 707b within an isolation wall structure 707 and a jogged via structure 721. As in the example in FIG. 7a, electrical connection is made between adjacent peripheral surfaces, not coaxially or concentrically aligned structures.

Figure 8A:
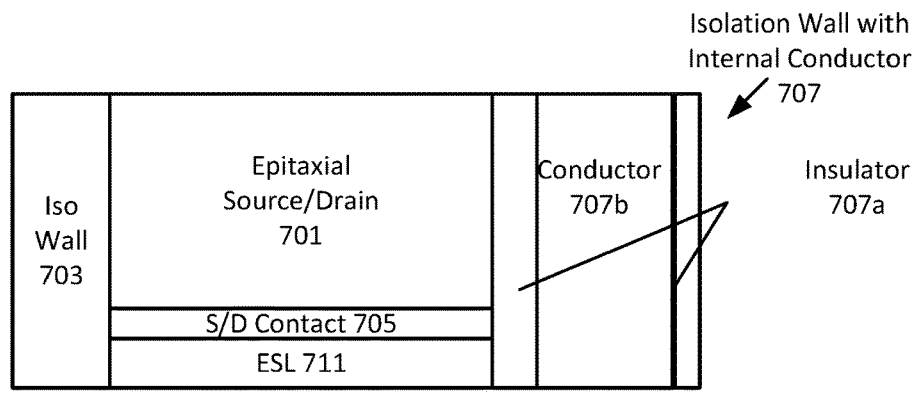

FIGS. 8a-8k illustrate various stages of a fabrication methodology of the example device 700. Turning first to FIG. 8a, an epitaxial source/drain 701 is formed on a substrate (not shown). Formation of the epitaxial source/drain 701 can include any of the techniques described above (e.g., epitaxial growth of "replacement" source/drain layers, etching/doping to produce "native" source/drains). The epitaxial source drain 701 is disposed between the first isolation wall 703 and the second isolation wall structure 707 that is formed so as to include a metal layer 707b within insulator layers 707a. These structures can be formed using lithographic patterning techniques and deposition techniques described above. A source/drain contact 705 is formed over the epitaxial source/drain 701 as described above. As also described above, the source/drain contact 705 can be fabricated from a conductive metal, a germanide, a silicide, combinations thereof, and may include one or more layers. An etch stop layer 711 is then formed on the source/drain contact 705. This etch stop layer 711 can be formed from a nitride, a carbide, or other material that is resistant to subtractive manufacturing processes such as wet or dry etches.

Figure 8B:
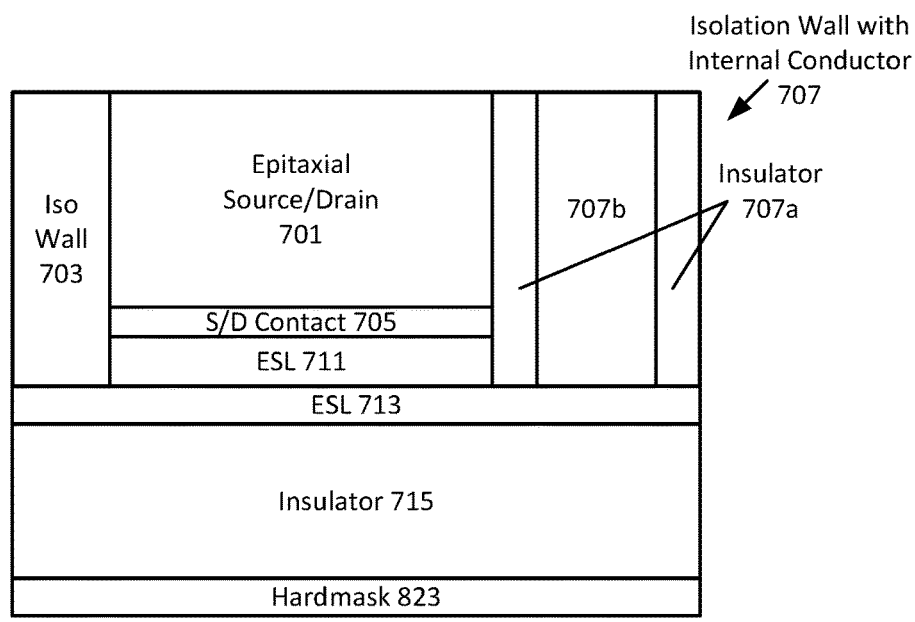

FIG. 8b illustrates formation of several additional layers over the architecture illustrated in FIG. 8a. These additional layers include formation of another etch stop layer 713 over the exposed etch stop layer 711, and over exposed surfaces of the isolation wall 703 and the isolation wall 707 (including exposed surfaces of insulator layers 707a and conductor 707b). An insulator layer 715 can then formed on the etch stop layer 713. The insulator layer 715 can be formed from a nitride, silicide, or oxide much other insulator layers described herein. A "hardmask" 823 is informed on insulator 715. This hardmask 823, often formed from an oxide or nitride composition, provides added protection to the underlying layers (in this case for example insulator layer 715) during subtractive manufacturing processes such as dry etching.

Figure 8C:
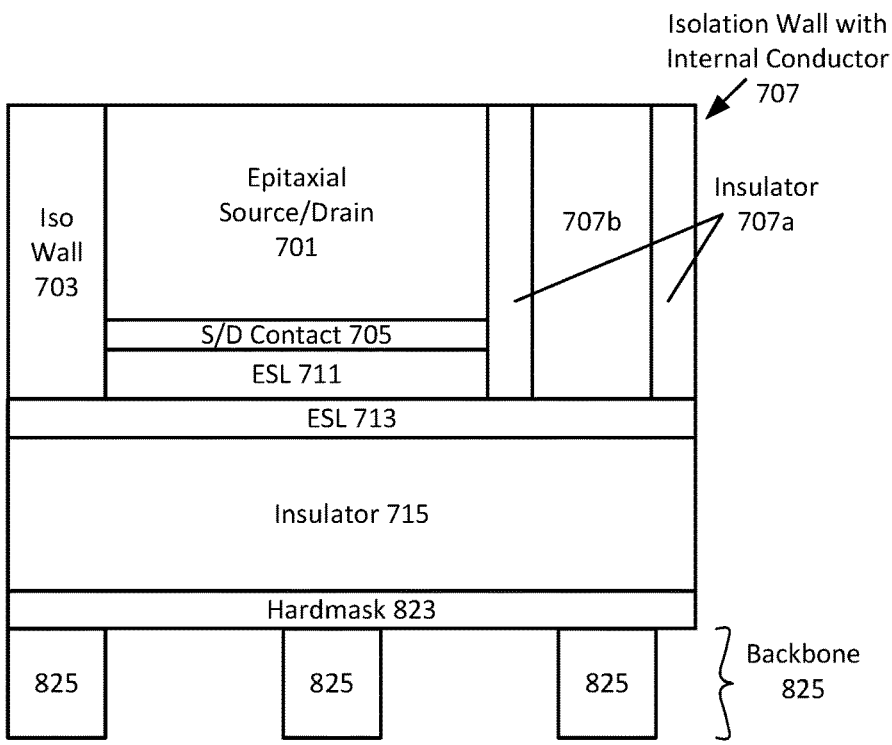

FIG. 8c illustrates the formation of a patterned "backbone" 825 on the hard mask. This backbone 825 can be formed by depositing a layer of amorphous silicon (e.g., through vapor deposition, sputtering, eBeam, or other deposition technique) and on the hardmask 823 and patterning the layer to produce the structures of the backbone 825 as shown. As will be appreciated, the backbone 825 is a material chosen for its etch-selectivity relative to neighboring materials that can be used to enhance the fabrication of structures having a desired pitch.

FIG. 8d shows the application of a layer of photoresist 806 over the backbone 825. As will be appreciated, the photoresist 806 can comprise a layer of photo active material that, in some examples, either polymerizes or depolymerizes upon exposure to a selected wavelength of radiation. Whether the photoresist is composed to polymerize or depolymerize in response to exposure to the radiation depends on whether the photoresist is intended to form a "negative" image or "positive" image of the pattern formed by exposure to the radiation through an intervening photolithographic mask (or "reticle"). In this case, either type of composition is suitable when paired with a corresponding reticle.

Figure 8F:
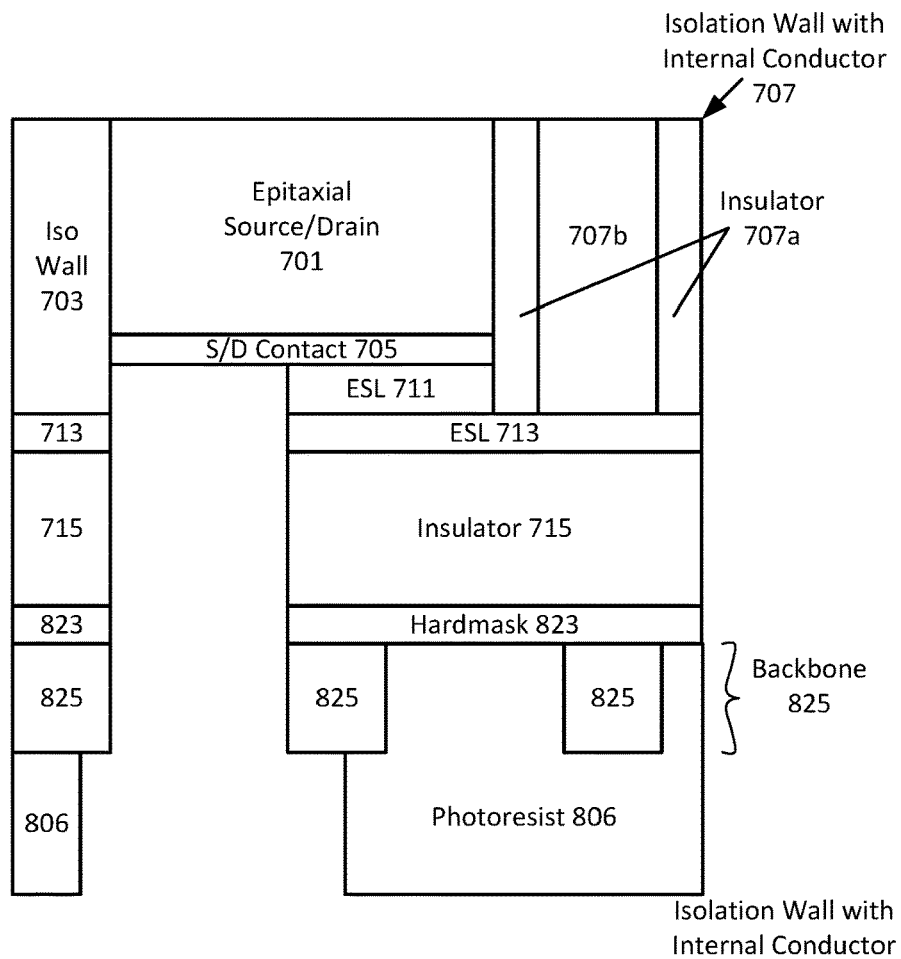

As shown in FIG. 8e, the photoresist 806 in this case is patterned so as to expose a portion of the hardmask 823 and a portion of one component of the backbone 825. The hardmask 823, the insulator 715, the etch stop layer 713, and the etch stop layer 711 are all partially etched (the hardmask 823 preventing or minimizing removal of the remaining portions of these layers) so as to expose a portion of the source drain contact 705. This configuration is shown in. FIG. 8f It will be appreciated that in some circumstances, a directional etch (e.g., a "dry" etch comprising a focused beam of ions or other accelerated particles) may be used to facilitate removal of only the portions of these layers aligned with a gap in the photoresist 806 shown in FIG. 8e. Note that the etch used is selective to the backbone, thus preferentially removing photoresist 806 faster than the m material in backbone structures 825.

Figure 8G:
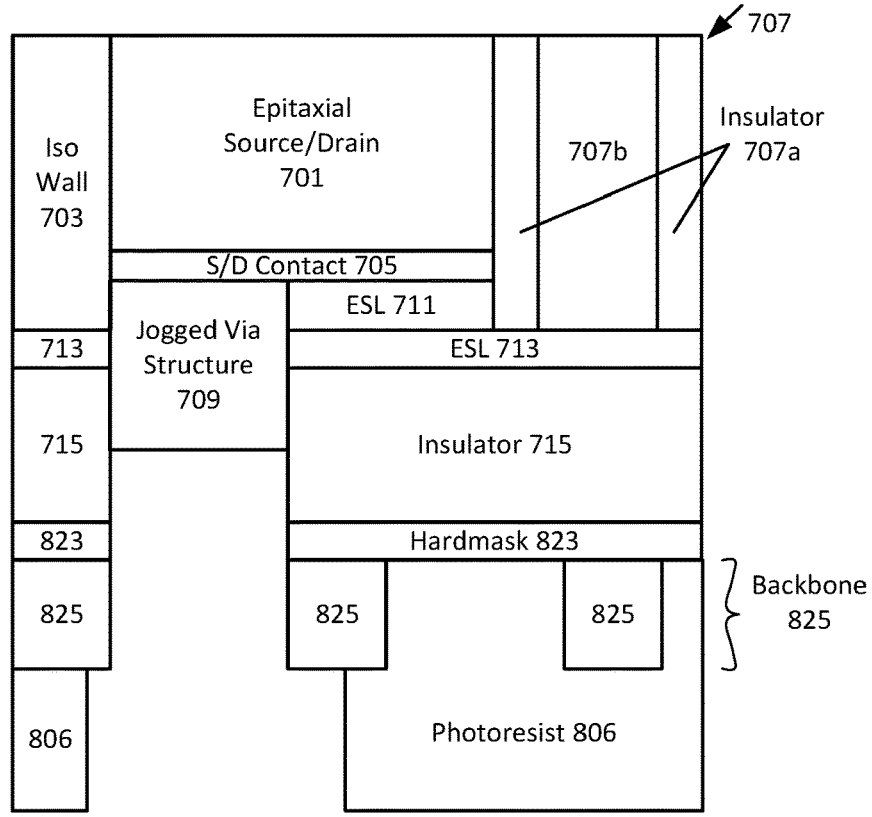

As shown in FIG. 8g, one or more layers of material are formed in electrical contact with the source/drain contact 705, thus forming a first portion of jogged via structure 709. In some examples a blanket layer of material can be formed on the exposed surfaces of FIG. 8f, which are then selectively etched to produce the jogged via structure 709 shown in FIG. 8g. As will be appreciated, formation of the jogged via structure 709 has a "self-aligning" aspect in that the surrounding layers naturally form a receptacle for the deposited material. The composition of the jogged via structure 709 can include any of the materials and layers described above for use in contact layers (e.g., conductive barrier layers such as nitrides, carbides, and carbon nitrides, conductive metals such as titanium, aluminum, copper, and conductive inter-metallics such as tantalum nitride, and titanium nitride). The jogged via structure 709 can be formed using any of the techniques described above including sputtering, chemical vapor deposition, among others.

Figure 8H:
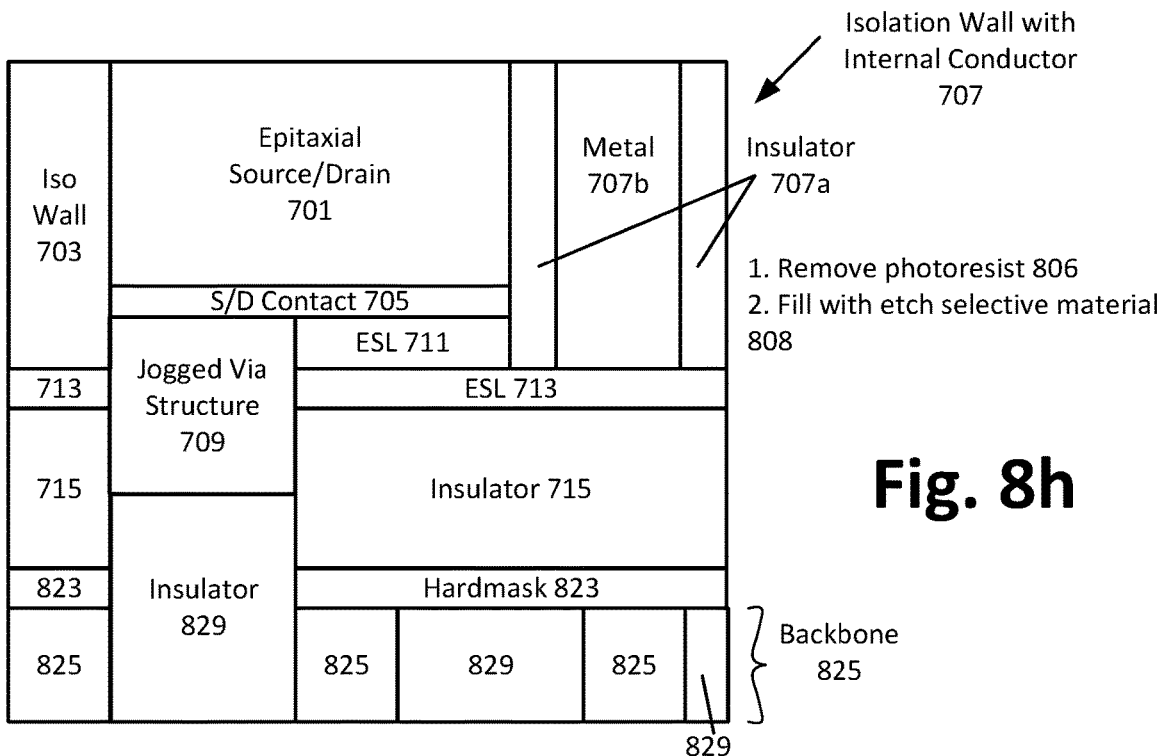
Figure 8I:
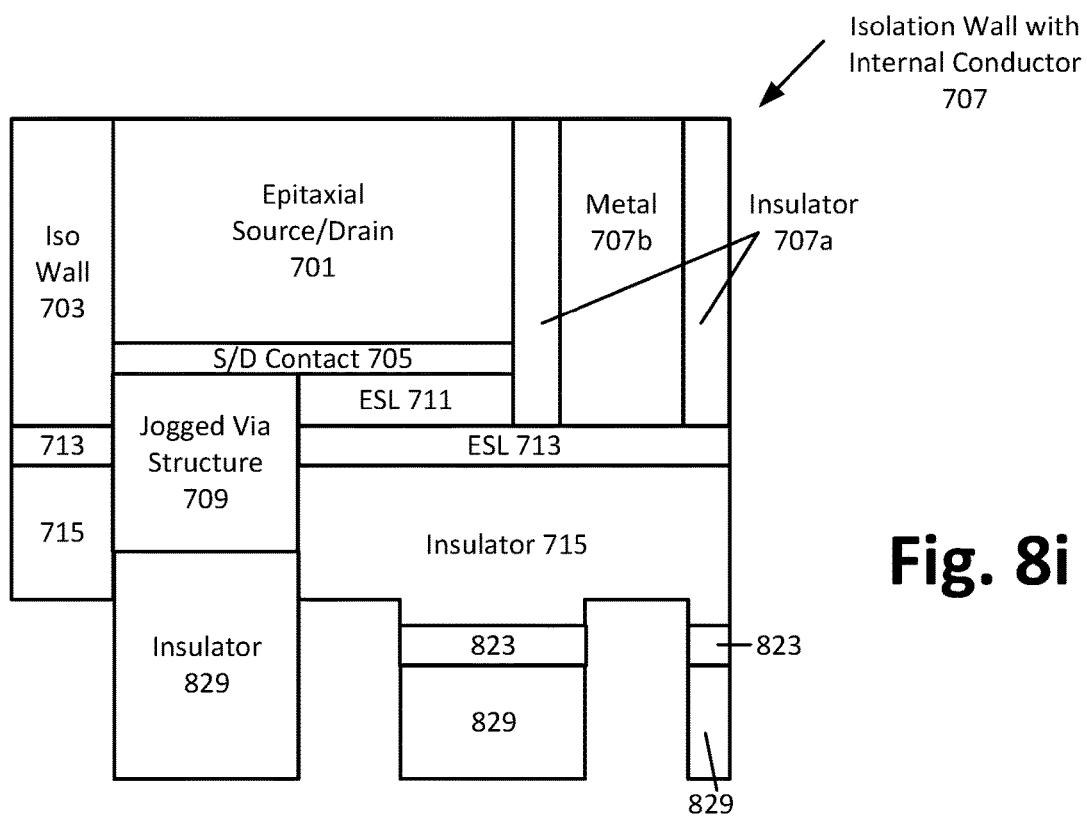

Turning now to FIG. 8h, the remaining portions of the layer of photoresist 806 are removed and an insulator layer 829 (e.g., aluminum dioxide) is formed over the jogged via structure 709 using any of the materials and techniques described above for the formation of insulator layers. The insulator layer 829 can be chosen with etch selectivity to amorphous silicon. As shown in FIG. 8i, the remaining portions of the backbone 825 can be removed using an etch that is selective to polysilicon (or the material used to form the backbone 825), thus exposing corresponding portions of the insulator 715. Furthermore, a portion of the hardmask 823 is removed to expose a portion of the insulator 715 in contact with the jogged via structure 709. In the event that any of the insulator 715 is removed, the removal is stopped before exposing the jogged via structure 709.

Figure 8J:
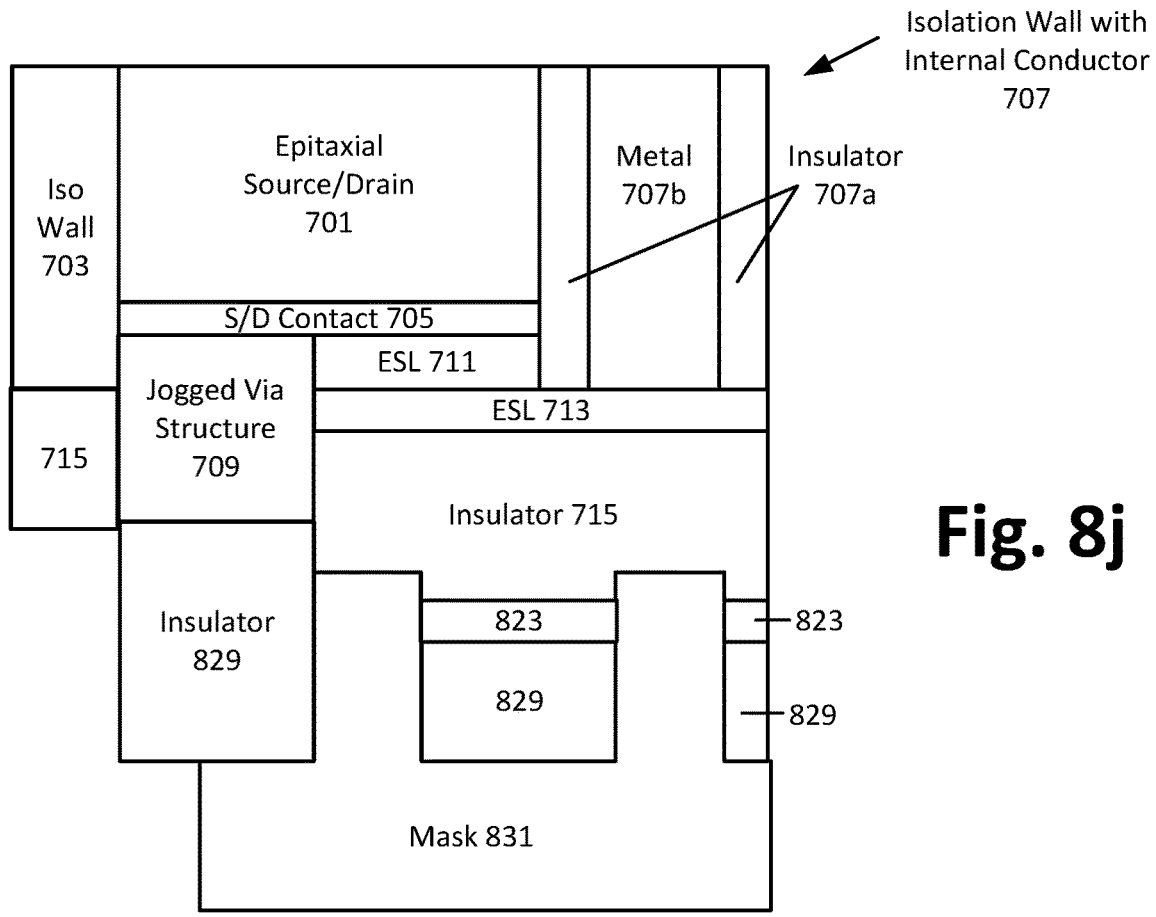

FIG. 8*j* shows the formation of photolithographic mask 831 that covers the exposed portions of the insulator 829, some portions of the insulator 715, and exposed peripheral surfaces of the layer 823. As for the above descriptions of photolithographic masks, the mask 831 can be, for example, a photoactive material or "hardmask" material that can be removed by an etch composition that preferentially removes the mask material.

Figure 8K:
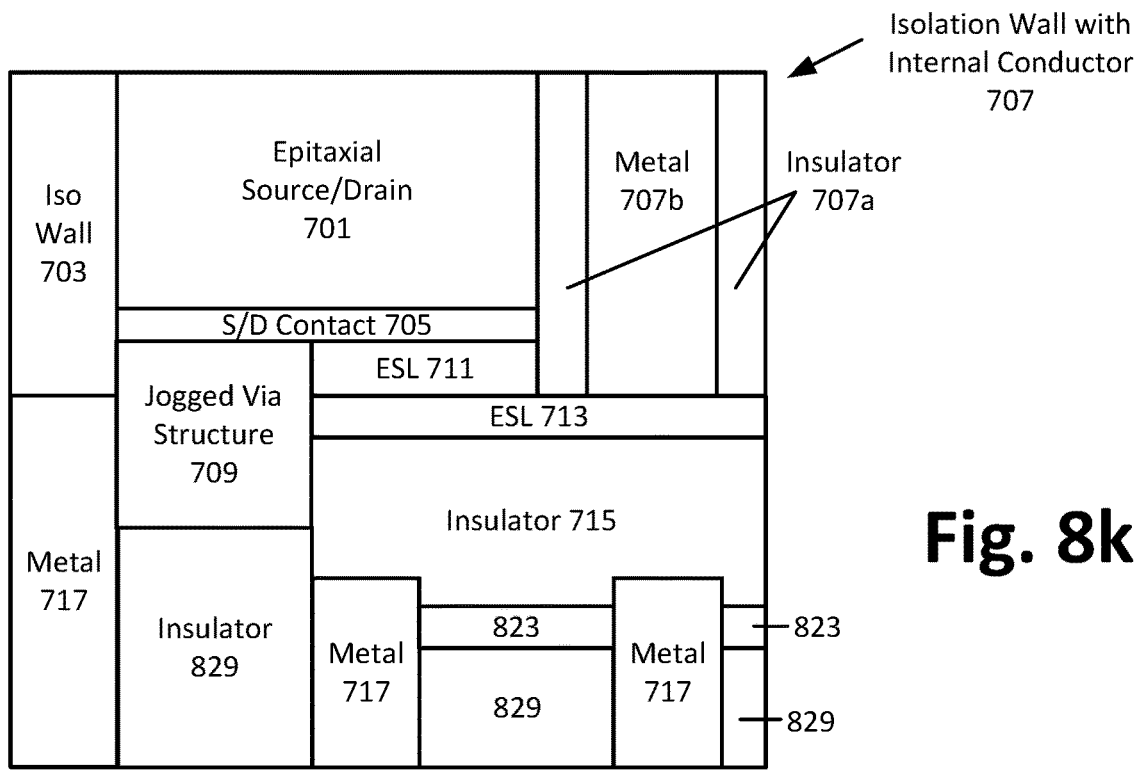

As shown in FIG. 8*k*, the exposed portion of the insulator 715 can removed to expose the jogged via structure 709. The mask 831 can then be removed. A layer of conductive material 717 can then be formed in the areas left vacant upon removal of the layers as described in the context of FIG. 8*j*. This completes formation of the jogged via structure 709, in which a peripheral surface of the jogged via 709 is in (direct or indirect) contact with a peripheral surface of the metal layer 717, which in this location can be considered an interconnection, whether a via or a metal line. Note, as indicated above, these structures are not coaxial, colinear, or concentrically aligned. Additional layers associated with semiconductor devices (e.g., "back end of line" interconnection layers, stacked semiconductor devices) can be formed on one or both sides of the device depicted in FIG. 8*k* (e.g., on one or both of the exposed surface of the source/drain 701 and/or the metal layer 717). Optionally, the insulator 829 can be selectively removed by an etch and replaced with a dielectric material (e.g., a low-k dielectric).

While not shown, it will be appreciated that the interconnect portion of the metal layer 717 that is in contact with the jogged via structure 709 can be connected to other interconnect structures. Furthermore, it will be appreciated that the jogged via structure 709 and the metal layer 717 in contact therewith can be used as a conduit to supply power to the semiconductor device having the source/drain 701 as a component. In other examples, these structures can be used as a pathway for signals. While not shown, it will be appreciated that the jogged via structure is not limited to the examples shown but can be adapted to establish electrical connection to "back end of line" interconnections (e.g., metal lines and vias), gate electrode structures, among other conductive structures within IC devices.

Example System

Figure 9:
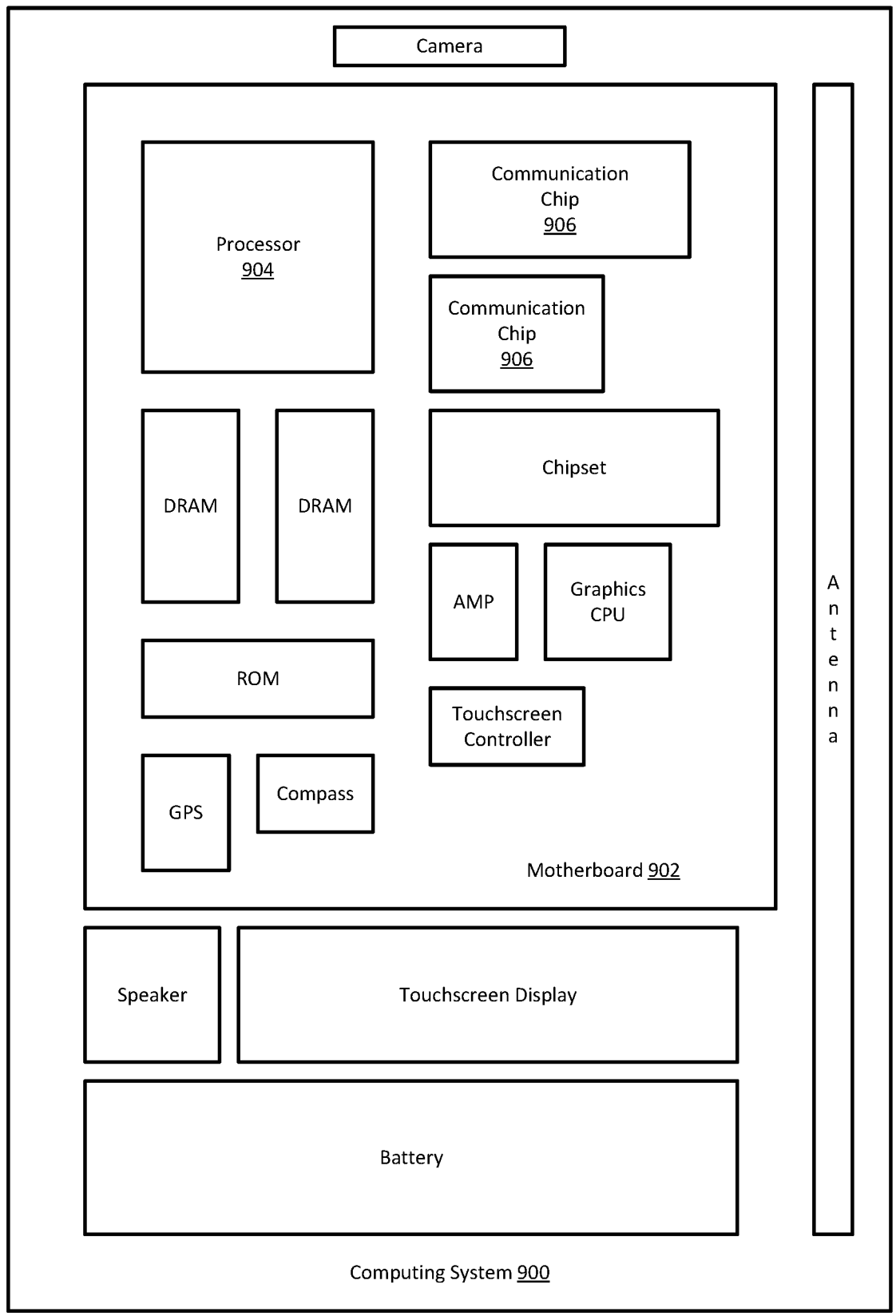
FIG. 9 illustrates a computing system including one or more of the integrated circuit structures that include angled local interconnects as variously described herein, in accordance with an embodiment of the present disclosure.

FIG. 9 is an example computing system implemented with one or more of the integrated circuit structures as disclosed herein, in accordance with some embodiments of the present disclosure. As can be seen, the computing system 900 houses a motherboard 902. The motherboard 902 may include a number of components, including, but not limited to, a processor 904 and at least one communication chip 906, each of which can be physically and electrically coupled to the motherboard 902, or otherwise integrated therein. As will be appreciated, the motherboard 902 may be, for example, any printed circuit board, whether a main board, a daughterboard mounted on a main board, or the only board of system 900, etc.

Depending on its applications, computing system 900 may include one or more other components that may or may not be physically and electrically coupled to the motherboard 902. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 900 may include one or more integrated circuit structures or devices configured in accordance with an example embodiment (e.g., to include angled local interconnect portions and/or jogged vias, as variously provided herein). In some embodiments, multiple functions can be integrated into one or more chips (e.g., for instance, note that the communication chip 906 can be part of or otherwise integrated into the processor 904).

The communication chip 906 enables wireless communications for the transfer of data to and from the computing system 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others. In some embodiments, communication chip 906 may include one or more transistor structures having a gate stack an access region polarization layer as variously described herein.

The processor 904 of the computing system 900 includes an integrated circuit die packaged within the processor 904. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 906 also may include an integrated circuit die packaged within the communication chip 906. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 904 (e.g., where functionality of any chips 906 is integrated into processor 904, rather than having separate communication chips). Further note that processor 904 may be a chip set having such wireless capability. In short, any number of processor 904 and/or communication chips 906 can be used. Likewise, any one chip or chip set can have multiple functions integrated therein.

In various implementations, the computing system 900 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is an integrated circuit structure comprising: a source region and a drain region; a first conductive structure over the source region and a second conductive structure over the drain region, the first conductive structure and the second conductive structure comprising a first conductive material; a third conductive structure comprising a second conductive material; and a dielectric structure comprising a dielectric material laterally between the third conductive structure and one of the first conductive structure or the second conductive structure, wherein a portion of the one of the first conductive structure or the second conductive structure extends laterally through the dielectric structure and contacts a sidewall of the third conductive structure, the portion being 1 nm or more long and having a surface at an angle of between 15° and 75° measured relative to a vertical plane.

Example 2 includes the subject matter of Example 1, wherein the first conductive structure, the second conductive structure, and the third conductive structure are within a device layer of the integrated circuit structure.

Example 3 includes the subject matter of Example 1 or 2, wherein the portion is above a first portion of the dielectric structure and below a second portion of the dielectric structure.

Example 4 includes the subject matter of any of the preceding Examples, wherein the one of the first conductive structure or the second conductive structure is a plug comprising a metal.

Example 5 includes the subject matter of any of the preceding Examples, wherein the one of the first conductive structure or the second conductive structure comprises a first portion and a second portion, the first portion comprising a first metal and the second portion comprising a second metal different from the first metal.

Example 6 includes the subject matter of any of the preceding Examples, wherein the third conductive structure is a conductor at least partially within an isolation wall structure.

Example 7 includes the subject matter of any of Examples 1-5, wherein the third conductive structure is a gate electrode.

Example 8 includes the subject matter of any of Examples 1-5, wherein the third conductive structure is a gate contact over a gate electrode.

Example 9 includes the subject matter of any of the preceding Examples, wherein the portion has a length from 1 nm to 10 nm.

Example 10 includes the subject matter of any of the preceding Examples, wherein the dielectric structure comprises one or both of a gate dielectric layer and a gate spacer.

Example 11 includes the subject matter of any of Examples 1-9, wherein the dielectric structure comprises at least one layer of an isolation wall structure.

Example 12 includes the subject matter of any of the preceding Examples, further comprising a semiconductor body between the source region and the drain region, the semiconductor body under at least a portion of the third conductive structure.

Example 13 includes the subject matter of any of the preceding Examples, wherein the semiconductor body is a fin.

Example 14 includes the subject matter of any of Examples 1-12, wherein the semiconductor body is one or more nanowires and/or nanoribbons.

Example 15 includes the subject matter of any of the preceding Examples, wherein the first conductive material and the second conductive material are the same material.

Example 16 is an integrated circuit device comprising the integrated circuit structure of any of the preceding Examples.

Example 17 is printed circuit board comprising the integrated circuit structure of any of the preceding Examples.

Example 18 is an electronic system comprising the integrated circuit structure of any of the preceding Examples.

Example 19 is an integrated circuit structure comprising: a source or drain region; a gate structure comprising a gate dielectric, a gate spacer, and one or more metals; and a contact structure over the source or drain region, wherein a portion of the gate structure extends laterally through one or both of the gate dielectric and the gate spacer and contacts a sidewall of the contact structure, the portion being 1 nm or more long and having a surface at an angle of between 15° and 75° measured relative to a vertical plane.

Example 20 includes the subject matter of Example 19, wherein the contact structure and the gate structure are within a device layer of the integrated circuit structure.

Example 21 includes the subject matter of either of Examples 19 or 20, wherein the m portion is above a first portion including one or both of the gate dielectric and gate spacer and below a second portion including one or both of the gate dielectric and gate spacer.

Example 22 includes the subject matter of any of Examples 19-21, wherein the contact structure is a plug comprising a metal.

Example 23 includes the subject matter of any of Examples 19-22, wherein the contact structure comprises a first portion and a second portion, the first portion comprising a first metal and the second portion comprising a second metal different from the first metal.

Example 24 includes the subject matter of any of Examples 19-23, wherein the portion of the gate structure that extends laterally is a gate electrode.

Example 25 includes the subject matter of any of Examples 19-23, wherein the portion of the gate structure that extends laterally is a gate contact over a gate electrode.

Example 26 includes the subject matter of any of Examples 19-25, wherein the portion has a length from 1 nm to 10 nm.

Example 27 includes the subject matter of any of Examples 19-26, wherein the portion of the gate structure extends laterally through both of the gate dielectric and the gate spacer.

Example 28 includes the subject matter of any of Examples 19-27, further comprising a semiconductor body adjacent the source or drain region, the semiconductor body under at least a portion of the gate structure.

Example 29 includes the subject matter of any of Examples 19-28, wherein the semiconductor body is a fin.

Example 30 includes the subject matter of any of Examples 19-28, wherein the semiconductor body is one or more nanowires and/or nanoribbons.

Example 31 includes the subject matter of any of Examples 19-30, wherein the contact structure and the portion of the gate structure that extends laterally are the same material.

Example 32 is an integrated circuit device comprising the integrated circuit structure of any of Examples 19-31.

Example 33 is a printed circuit board comprising the integrated circuit structure of any of Examples 19-32.

Example 34 is an electronic system comprising the integrated circuit structure of any of Examples 19-33.

Example 35 is an integrated circuit device structure comprising: a source region and a drain region; a first contact structure over the source region and a second contact structure over the drain region; a jogged via structure having a first surface in contact with one of the first to contact structure or the second contact structure, the jogged via having a second surface at an angle of from 45° to 90° relative to the first surface; and a conductor having a peripheral surface in contact with the second surface of the jogged via structure.

Example 36 includes the subject matter of Example 35, wherein the conductor is not concentrically aligned with the jogged via structure.

Example 37 includes the subject matter of either of Example 35 or 36, further comprising a power supply circuit connected to the conductor.

Example 38 includes the subject matter of either of Example 35 or 36, further comprising a signal circuit connected to the conductor.

Example 39 includes the subject matter of any of Examples 35-38, wherein the first surface of the jogged via structure is a top or bottom surface of the jogged via structure, and the second surface of the jogged via structure is a sidewall surface of the jogged via structure.

Example 40 includes the subject matter of any of Examples 35-39, wherein the jogged via structure is on a back side of a device layer, the device layer including the source region and the drain region, the integrated circuit device structure further including one or more interconnect layers above the device layer.

Example 41 is an integrated circuit device comprising: a gate structure; a jogged via structure having a first surface in contact with the gate structure, the jogged via having a second surface at an angle of from 45° to 90° relative to the first surface; and a conductor having a peripheral surface in contact with the second surface of the jogged via structure.

Example 42 includes the subject matter of Example 41, wherein the conductor is not concentrically aligned with the jogged via structure.

Example 43 includes the subject matter of either of Examples 41 or 42, further comprising a power supply circuit connected to the conductor.

Example 44 includes the subject matter of Example 41 or 42, further comprising a signal circuit connected to the conductor.

Example 45 includes the subject matter of any of Examples 41-44, wherein the first surface of the jogged via structure is a top or bottom surface of the jogged via structure, and the second surface of the jogged via structure is a sidewall surface of the jogged via structure.

Example 46 includes the subject matter of any of Examples 41-45, wherein the jogged via structure is on a back side of a device layer, the device layer including a source region and a drain region, the integrated circuit structure further including one or more interconnect layers above the device layer.

Example 47 is a method for fabricating an integrated circuit structure, the method comprising: forming a source region and a drain region; forming a conductive structure laterally adjacent to the source region or the drain region; forming a dielectric structure laterally between the conductive structure and one of the source region and the drain region; exposing a portion of the dielectric structure above one of the source region or the drain region; removing at least some of the exposed dielectric structure, the removing exposing a sidewall portion of the conductive structure; and depositing conductive material over the one of the source region or the drain region, the conductive material connecting the exposed sidewall portion of the conductive structure to the one of source region or the drain region.

Example 48 includes the subject matter of Example 47, wherein removing at least some of the exposed dielectric structure comprises exposing at least some of the exposed dielectric structure to a beam of energetic particles.

Example 49 includes the subject matter of Example 48, wherein the beam of energetic particles is provided at an angle of between 15° and 75° relative to a vertical plane.

Example 50 includes the subject matter of Example 48, wherein a beam diameter is less than a height of the exposed portion of the dielectric structure, the removing thus leaving a remnant portion.

Example 51 is a method for fabricating an integrated circuit structure, the method comprising: forming a source region and a drain region; forming a contact structure over the source region or the drain region; forming a dielectric structure laterally adjacent to the source region and the drain region; exposing a portion of the dielectric structure above a channel region, the channel region between the source region and the drain region; removing at least some of the exposed dielectric structure, the removing exposing a sidewall portion of the contact structure; and depositing conductive material over the channel region, the conductive material connecting the exposed sidewall portion of the contact structure.

Example 52 includes the subject matter of Example 51, wherein removing at least some of the exposed dielectric structure comprises exposing at least some of the exposed dielectric structure to a beam of energetic particles.

Example 53 includes the subject matter of Example 52, wherein the beam of energetic particles is provided at an angle of between 15° and 75° relative to a vertical plane.

Example 54 includes the subject matter of Example 52, wherein a beam diameter is less than a height of the exposed portion of the dielectric structure, the removing thus leaving a remnant portion.

Example 55 is a method for fabricating an integrated circuit structure, the method comprising: forming a first conductive structure; forming a jogged via structure having a first surface and a second surface, the first surface on at least a portion of the first conductive structure, the first surface and the second surface at an angle to one another of from 45° to 90°; and forming a second conductive structure in electrical contact with the second surface of the jogged via structure.

Example 56 includes the subject matter of Example 55, wherein the jogged via structure and the second conductive structure are not colinearly or concentrically aligned.

Example 57 includes the subject matter of either one of Examples 55 or 56, wherein the first conductive structure is one of a source or a drain.

Example 58 includes the subject matter of either one of Examples 55 or 56, wherein the first conductive structure is a gate electrode structure.

Example 59 includes the subject matter of any of Examples 55-58, wherein the second conductive structure is one of a metal line or a conductor.

Example 60 includes the subject matter of any of Examples 55-59, further comprising a contact between the first conductive structure and the jogged via structure.

What is claimed is:

1. An integrated circuit structure comprising:
   a source region and a drain region;
   a first conductive structure over the source region and a second conductive structure over the drain region, the first conductive structure and the second conductive structure comprising a first conductive material;
   a third conductive structure comprising a second conductive material; and
   a dielectric structure comprising a dielectric material laterally between the third conductive structure and one of the first conductive structure or the second conductive structure,
   wherein a portion of the one of the first conductive structure or the second conductive structure extends laterally through the dielectric structure and contacts a sidewall of the third conductive structure, the portion being 1 nm or more long and having a surface at an angle of between 15° and 75° measured relative to a vertical plane.

2. The integrated circuit structure of claim 1, wherein the first conductive structure, the second conductive structure, and the third conductive structure are within a device layer of the integrated circuit structure.

3. The integrated circuit structure of claim 1, wherein the one of the first conductive structure or the second conductive structure is a plug comprising a metal.

4. The integrated circuit structure of claim 1, wherein the third conductive structure is a conductor at least partially within an isolation wall structure.

5. The integrated circuit structure of claim 1, wherein the third conductive structure is a gate electrode.

6. The integrated circuit structure of claim 1, wherein the third conductive structure is a gate contact over a gate electrode.

7. An integrated circuit device comprising the integrated circuit structure of claim 1.

8. A printed circuit board comprising the integrated circuit structure of claim 1.

9. An electronic system comprising the integrated circuit structure of claim 1.

10. An integrated circuit structure comprising:
    a source or drain region;
    a gate structure comprising a gate dielectric, a gate spacer, and one or more metals; and
    a contact structure over the source or drain region,
    wherein a portion of the gate structure extends laterally through one or both of the gate dielectric and the gate spacer and contacts a sidewall of the contact structure, the portion being 1 nm or more long and having a surface at an angle of between 15° and 75° measured relative to a vertical plane.

11. The integrated circuit structure of claim 10, wherein the contact structure comprises a first portion and a second portion, the first portion comprising a first metal and the second portion comprising a second metal different from the first metal.

12. The integrated circuit structure of claim 10, wherein the portion of the gate structure that extends laterally is a gate electrode.

13. The integrated circuit structure of claim 10, wherein the portion of the gate structure that extends laterally is a gate contact over a gate electrode.

14. The integrated circuit structure of claim 10, wherein the portion of the gate structure extends laterally through both of the gate dielectric and the gate spacer.

15. The integrated circuit structure of claim 10, further comprising a semiconductor body adjacent the source or drain region, the semiconductor body under at least a portion of the gate structure.

16. An electronic system comprising the integrated circuit structure of claim 10.

17. An integrated circuit device structure comprising:
    a source region and a drain region;
    a first contact structure over the source region and a second contact structure over the drain region;
    a jogged via structure having a first surface in contact with one of the first contact structure or the second contact structure, the jogged via having a second surface at an angle of from 45° to 90° relative to the first surface; and
    a conductor having a peripheral surface in contact with the second surface of the jogged via structure.

18. The integrated circuit device structure of claim 17, wherein the conductor is not concentrically aligned with the jogged via structure.

19. The integrated circuit device structure of claim 17, further comprising a power supply circuit connected to the conductor.

20. The integrated circuit device structure of claim 17, further comprising a signal circuit connected to the conductor.

21. The integrated circuit device structure of claim 17, wherein the first surface of the jogged via structure is a top or bottom surface of the jogged via structure, and the second surface of the jogged via structure is a sidewall surface of the jogged via structure.

22. An integrated circuit device structure comprising:
    a gate structure;
    a jogged via structure having a first surface in contact with the gate structure, the jogged via having a second surface at an angle of from 45° to 90° relative to the first surface; and
    a conductor having a peripheral surface in contact with the second surface of the jogged via structure.

23. The integrated circuit device structure of claim 22, wherein the conductor is not concentrically aligned with the jogged via structure.

24. The integrated circuit device structure of claim 22, further comprising a power supply circuit connected to the conductor.

25. The integrated circuit device structure of claim 22, further comprising a signal circuit connected to the conductor.

* * * * *